US011630392B2

(12) United States Patent
Nakashima

(10) Patent No.: US 11,630,392 B2
(45) Date of Patent: Apr. 18, 2023

(54) SUBSTRATE PROCESSING APPARATUS

(71) Applicant: Tokyo Electron Limited, Tokyo (JP)

(72) Inventor: Tsunenaga Nakashima, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 331 days.

(21) Appl. No.: 16/666,717

(22) Filed: Oct. 29, 2019

(65) Prior Publication Data

US 2020/0064741 A1 Feb. 27, 2020

Related U.S. Application Data

(62) Division of application No. 14/508,005, filed on Oct. 7, 2014, now abandoned.

(30) Foreign Application Priority Data

Oct. 8, 2013 (JP) ................................ 2013-211066
Oct. 8, 2013 (JP) ................................ 2013-211079

(51) Int. Cl.
*G03F 7/30* (2006.01)
*G03F 7/16* (2006.01)
(Continued)

(52) U.S. Cl.
CPC ................ *G03F 7/30* (2013.01); *G03F 7/162* (2013.01); *G03F 7/3021* (2013.01);
(Continued)

(58) Field of Classification Search
CPC ......... H01L 21/67196; H01L 21/67703; H01L 21/67739
See application file for complete search history.

(56) References Cited

U.S. PATENT DOCUMENTS 4,979,643 A 12/1990 Lipisko
5,305,650 A * 4/1994 Koike ..................... G01N 1/28
73/864.21
(Continued)

FOREIGN PATENT DOCUMENTS

JP    H05-082896 U    11/1993
JP    2000-031000 A    1/2000
(Continued)

*Primary Examiner* — Karla A Moore
*Assistant Examiner* — Margaret Klunk
(74) *Attorney, Agent, or Firm* — Pearne & Gordon LLP

(57) ABSTRACT

In a chemical liquid container replacement device D2 configured to replace a chemical liquid container 50, multiple chemical liquid containers 50 respectively connected to base end sides of chemical liquid supply paths configured to supply chemical liquids, and a nozzle attachment/detachment device 61 is configured to attach/detach the base end side of the chemical liquid supply path with respect to the chemical liquid container 50 of a container arrangement section 60. A loading/unloading port 62 loads a new chemical liquid container 50 for performing a liquid process on a substrate W and unloads a completely used chemical liquid container 50. A container transfer device 7 unloads the completely used chemical liquid container 50 from the container arrangement section 60 toward the loading/unloading port 62 and loads the new chemical liquid containers 50 from the loading/unloading port 62 toward the container arrangement section 60.

4 Claims, 19 Drawing Sheets

(51) Int. Cl.
*H01L 21/67* (2006.01)
*H01L 21/677* (2006.01)
(52) U.S. Cl.
CPC .. *H01L 21/67017* (2013.01); *H01L 21/67196* (2013.01); *H01L 21/67703* (2013.01); *H01L 21/67739* (2013.01)

(56) References Cited

U.S. PATENT DOCUMENTS

| | | | |
|---|---|---|---|
| 6,165,255 A | 12/2000 | Lai | |
| 7,474,377 B2 * | 1/2009 | Matsuoka | H01L 21/67178 355/53 |
| 2002/0000240 A1 * | 1/2002 | Kamikawa | H01L 21/67303 134/57 R |
| 2003/0051995 A1 * | 3/2003 | Nobata | C25D 21/08 204/199 |
| 2012/0181239 A1 * | 7/2012 | Furusho | H01L 21/67017 210/97 |

FOREIGN PATENT DOCUMENTS

| | | |
|---|---|---|
| JP | 2001-118782 A | 4/2001 |
| JP | 2003-071367 A | 3/2003 |
| JP | 2003-266006 A | 9/2003 |
| JP | 2010-171258 A | 8/2010 |
| JP | 2011-204944 A | 10/2011 |
| JP | 2013102235 A * | 5/2013 |

\* cited by examiner

SUBSTRATE PROCESSING APPARATUS

CROSS-REFERENCE TO RELATED APPLICATION

This is a divisional application of U.S. patent application Ser. No. 14/508,005, filed on Oct. 7, 2014, which claims the benefit of Japanese Patent Application Nos. 2013-211066 and 2013-211079 filed on Oct. 8, 2013 and Oct. 8, 2013, respectively, the entire disclosures of which are incorporated herein by reference.

TECHNICAL FIELD

The embodiments described herein pertain generally to technology of replacing a chemical liquid container, which stores therein a chemical liquid, in a substrate processing apparatus which performs a process on a substrate with the chemical liquid.

BACKGROUND

In a photoresist process as one of the semiconductor manufacturing processes, a resist is coated on a surface of a semiconductor wafer (hereinafter, referred to as "wafer"), and then the resist is exposed and developed in a preset pattern to form a resist pattern. This process is generally performed using a system in which an exposure apparatus is connected to a coating and developing apparatus (substrate processing apparatus) for coating and developing the resist.

The coating and developing apparatus supplies various kinds of chemical liquids to the wafer in sequence using liquid processing modules and performs various kinds of processes, such as a resist coating process or developing process, included in the photoresist process. For this reason, the coating and developing apparatus includes an accommodation region for chemical liquid containers in which various kinds of chemical liquids are stored, and the chemical liquids are supplied to the respective liquid processing modules therefrom.

When a process is performed on multiple wafers and a chemical liquid container becomes empty, the empty ("completely used") chemical liquid container is unloaded from the accommodation region by, for example, an operator, and then replaced with a new chemical liquid container. However, some of the chemical liquids used in the coating and developing apparatus may be deteriorated in characteristics by being contacted with air, and an operation of opening the accommodation region and replacing the chemical liquid container may cause a problem that a uniform process cannot be stably preformed on the wafers. Further, when the chemical liquid container is replaced, if foreign particles enter the container, the chemical liquid mixed with the particles may be supplied to a wafer and may contaminate the wafer.

Patent Document 1 describes a liquid supply device of continuously supplying a liquid. In the liquid supply device, a container, which stores a resist liquid or the like, is mounted on a table configured to be moved up and down with respect to a cap including a liquid suction pipe and the liquid suction pipe is inserted into and separated from the container by moving the table up and down. Further, in Patent Document 2, an IC tag seal, which stores information on content of a processing liquid container, is attached to the processing liquid container storing the processing liquid. Further, after the container is provided in one of arrangement regions capable of accommodating multiple containers, information read from the IC tag seal is compared with information on content of the containers to be provided in the respective arrangement regions. As a result, the container, which stores the wrong processing liquid, is suppressed from being provided in a substrate processing apparatus, which performs a resist coating and developing process.

However, both Patent Documents do not describe a technology that suppresses a liquid from being deteriorated or particles from being mixed with the liquid, when a completely used container provided on a table or in an arrangement region is replaced with a new container.

Patent Document 1: Japanese Utility Model Laid-open Publication No. H05-082896 (Paragraphs 0006 to 0007, and FIG. 1)

Patent Document 2: Japanese Patent Laid-open Publication No. 2010-171258 (claim 1, Paragraphs 0082 to 0083 and 0135 to 0136, and FIG. 6)

SUMMARY

In view of the foregoing, example embodiments provide a chemical liquid container replacement device, a container mounting module, and a chemical liquid container replacement method of replacing a chemical liquid container under the clean atmosphere. Further, the example embodiments provide a substrate processing apparatus in which the chemical liquid container can be replaced without using the hands of the operator.

In one example embodiment, a chemical liquid container replacement device includes a container arrangement section in which multiple chemical liquid containers respectively connected with base end sides of chemical liquid supply paths are arranged; an attachment/detachment device configured to attach and detach the base end side of the chemical liquid supply path with respect to the chemical liquid container arranged in the container arrangement section; a loading/unloading port through which a new chemical liquid container storing therein a chemical liquid to perform a liquid process on a substrate is loaded and a completely used chemical liquid container is unloaded; and a container transfer device configured to unloaded the completely used chemical liquid container from the container arrangement section through the loading/unloading port and load the new chemical liquid container into the container arrangement section through the loading/unloading port.

Further, the chemical liquid container replacement device may further include a cover opening/closing device configured to close a chemical liquid suction opening of the completely used chemical liquid container, from which the chemical liquid supply path is separated, with a cover, and configured to open a chemical liquid suction opening of the new chemical liquid container by separating a cover of the new chemical liquid container.

The cover opening/closing device may be provided to open and close a cover of a chemical liquid container arranged in the container arrangement section.

A transfer region of the container transfer device and the container arrangement section may be provided within a space partitioned from an external atmosphere.

The chemical liquid container replacement device may further include a gas supply device configured to supply a clean gas into the space partitioned from the external atmosphere.

The chemical liquid container replacement device may further include an inert gas supply device configured to supply an inert gas into the space partitioned from the external atmosphere.

The container arrangement section may be formed of a container rack in which multiple plates for horizontally arranging the multiple chemical liquid containers are vertically stacked.

Multiple arrangement regions where the chemical liquid containers are respectively provided may be horizontally arranged in the container arrangement section, and the container arrangement section and processing blocks including a liquid processing module configured to perform the liquid process on the substrate by supplying the chemical liquid through the chemical liquid supply path may be stacked.

The chemical liquid container replacement device may further include an acquisition device configured to acquire identification information for identifying a kind of the chemical liquid stored in the chemical liquid container loaded through the loading/unloading port; and a transfer controller configured to control the container transfer device. Further, in the container arrangement section, the chemical liquid containers storing different kinds of chemical liquids therein may be respectively arranged to correspond to preset arrangement positions, and when the kind of the chemical liquid identified by the identification information acquired in the acquisition device is identical with a kind of a chemical liquid corresponding to the arrangement position of a transfer target position of the chemical liquid container loaded through the loading/unloading port, the transfer controller may transfer the chemical liquid container to the arrangement position.

The chemical liquid supply paths may be connected to a resist coating module configured to coat a resist on the substrate and a developing module configured to supply a developing liquid to the substrate after being exposed, and the chemical liquid containers storing a resist liquid or a developing liquid therein may be arranged in the container arrangement section.

In another example embodiment, a substrate processing apparatus includes a carrier block to which a carrier accommodating multiple substrates is loaded; a processing block, horizontally arranged in parallel with the carrier block, including a liquid processing module configured to perform a liquid process on a substrate unloaded from the carrier within the carrier block by supplying a chemical liquid to the substrate; and a chemical liquid block arranged in a row to be parallel with the carrier block and the processing block and configured to accommodate multiple chemical liquid containers each storing the chemical liquid to be supplied to the liquid processing module. Further, the chemical liquid block includes a container arrangement section in which the multiple chemical liquid containers are arranged in a direction orthogonal to an arrangement direction of the carrier block and the processing block; a loading/unloading port through which the chemical liquid container is loaded and unloaded; and a device configured to automatically replace a completely used chemical liquid container with a new chemical liquid container between the container arrangement section and the loading/unloading port.

A path for the substrate may be formed in the chemical liquid block.

The path for the substrate may be surrounded by a cylindrical member extended in a moving direction of the substrate.

The chemical liquid block may be provided between the carrier block and the processing block.

The processing block may include a first liquid processing module configured to perform a liquid process on the substrate with a chemical liquid in order to form a coating film including a resist film on the substrate; and a second liquid processing module configured to perform a developing process on the substrate after being exposed with a developing liquid serving as the chemical liquid. Further, an interface block connected to an exposure device and configured to transfer the substrate between the processing block and the exposure device may be provided at a side opposite to the carrier block when viewed from the processing block, and the chemical liquid block may be provided between the processing block and the interface block.

When an arrangement direction of the carrier block and the processing block is set to be a forward/backward direction, a loading/unloading opening for the chemical liquid container may be formed at least one of left and right sides of the chemical liquid block while surrounding the chemical liquid block.

A loading/unloading opening for the chemical liquid container may be formed on a ceiling portion surrounding the chemical liquid block.

In accordance with the example embodiments, there is provided the container arrangement section in which the chemical liquid containers are arranged, the chemical liquid containers in the container arrangement section are replaced using the container transfer device, and the chemical liquid supply pipe is attached and detached by the attachment/detachment device. Therefore, it is possible to provide the container arrangement section within the space partitioned from the external atmosphere and replace the chemical liquid container without using the hands of the operator. As a result thereof, it is possible to suppress contaminants such as particles from being mixed with the chemical liquid container, and also possible to reduce deterioration of the chemical liquid by supplying the inert gas into the container arrangement section. Further, in accordance with the example embodiments, the completely used chemical liquid container is replaced with a new chemical liquid container between the container arrangement section and the loading/unloading port by the device configured to automatically replace the chemical liquid containers. For this reason, the container arrangement section can be provided such that the multiple chemical liquid containers are arranged in parallel with each other toward the direction orthogonal to the arrangement direction of the carrier block and the processing block. Therefore, it is possible to replace the chemical liquid container even if it is difficult for the operator to perform the operation.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
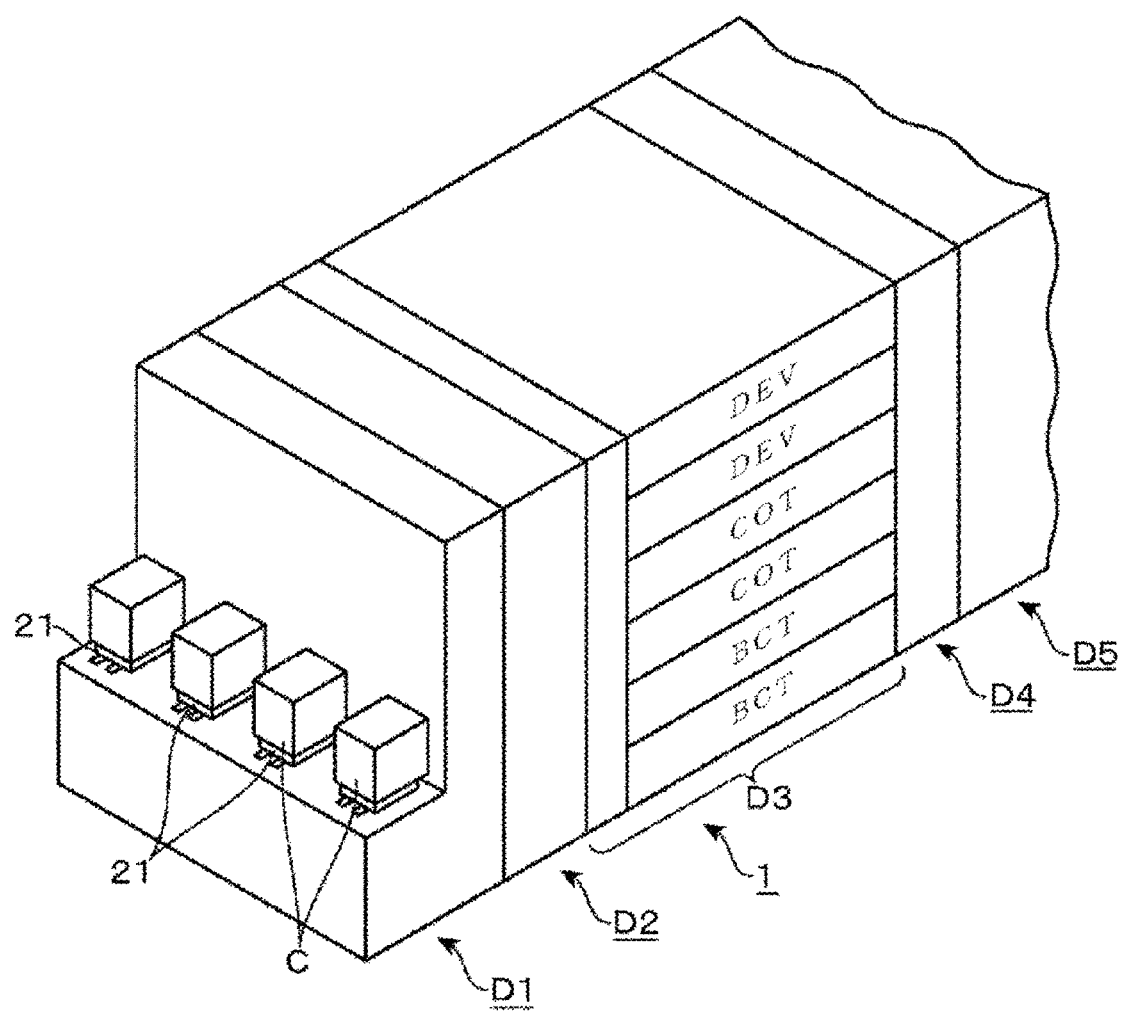
FIG. 1 is a perspective view of external appearance of a coating and developing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A configuration of a coating and developing apparatus 1 (substrate processing apparatus) to which example embodiments are applied will be explained with reference to FIG. 1 to FIG. 9. As depicted in FIG. 1, the coating and developing apparatus 1 of the present example embodiment includes a carrier block D1, a chemical liquid block D2, a processing block D3, and an interface block D4 linearly connected to each other in this sequence. The interface block D4 is further connected to an exposure device D5. Hereinafter, the arrangement direction of the blocks D1 to D4 will be referred to as "forward/backward direction" and one end side at which the carrier block D1 is arranged will be referred to as "front side".

Figure 2:
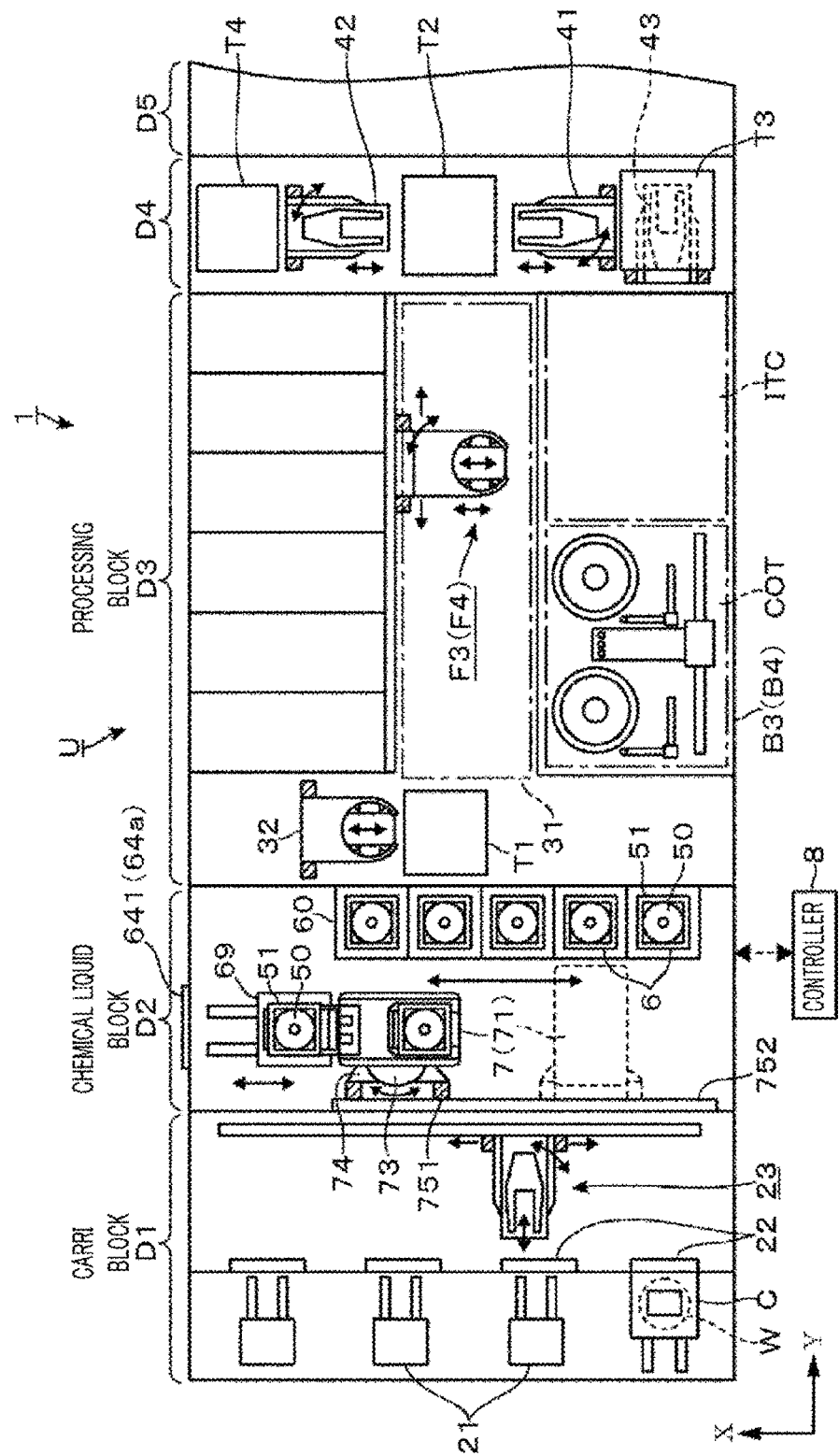
FIG. 2 is a plane view of the coating and developing apparatus.

The carrier block D1 is configured to load and unload a wafer W between a carrier C including a FOUP (Front Opening Unified Pod), which is configured to accommodate multiple wafers W of the same lot, and the coating and developing apparatus 1. As depicted in FIG. 2, the carrier block D1 includes a mounting table 21 for the carrier C, an opening/closing device 22 configured to open and close a cover of the carrier C, and a transfer arm 23 configured to unload a wafer W from the carrier C and transfer the wafer W.

Figure 3:
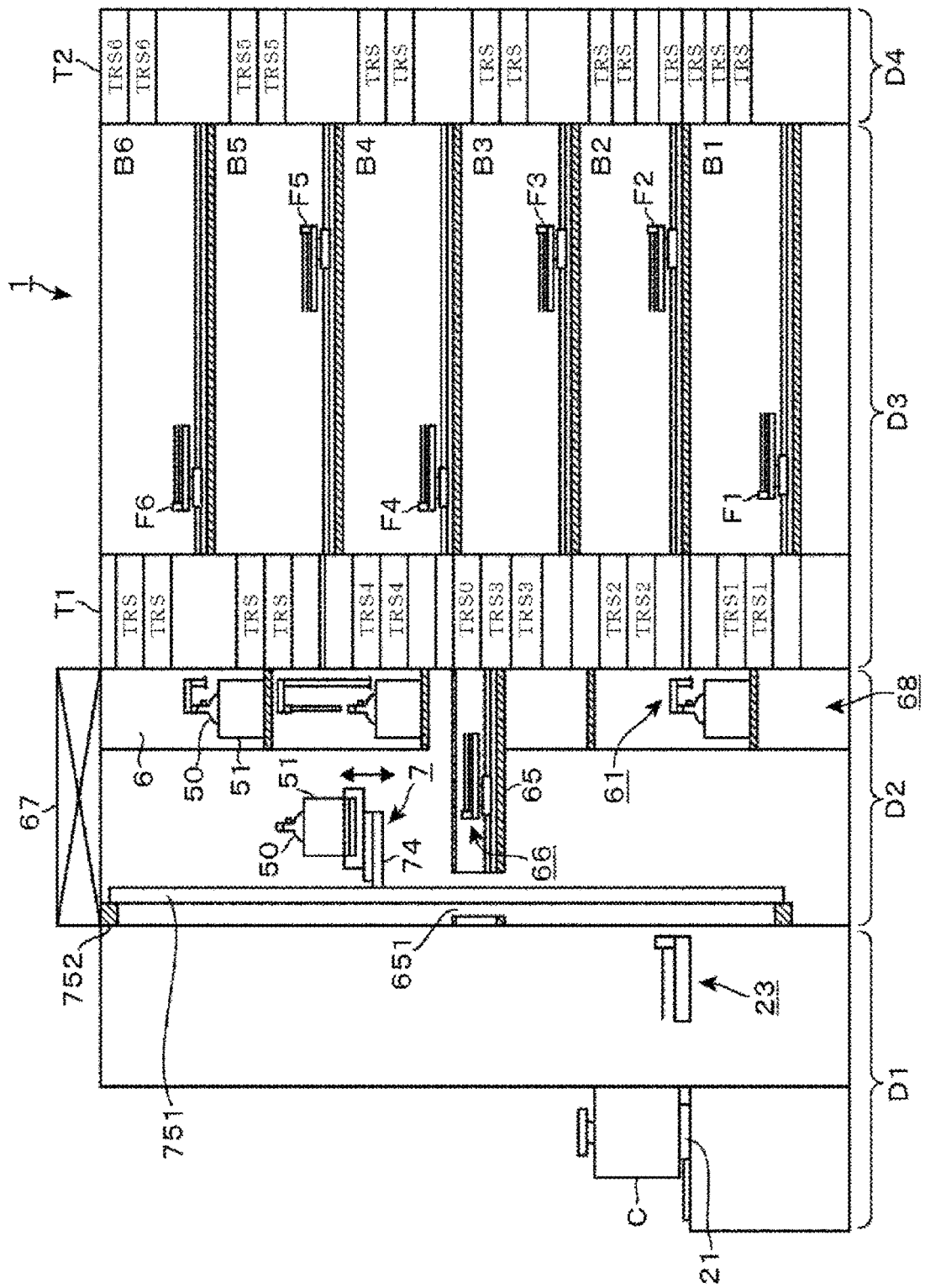
FIG. 3 is a longitudinal side view of the coating and developing apparatus.

As depicted in FIG. 1 and FIG. 3, in the processing block D3, first to sixth unit blocks B1 to B6 configured to perform a liquid process on the wafer W are stacked in sequence from the bottom. For convenience of explanation, in some cases, a process of forming an anti-reflection film on the wafer W, a process of forming a resist film on the wafer W, and a process of forming a resist pattern on the exposed wafer W may be expressed as "BCT", "COT", and "DEV", respectively. In the present example embodiment, two BCT layers B1 and B2, two COT layers B3 and B4, and two DEV layers B5 and B6 are stacked from the bottom. In the unit blocks of the same type, the wafers W are transferred and processed at the same time.

FIG. 2 illustrates the COT layer B3 (B4) as a representative of the unit blocks. In the COT layer B3 (B4), a transfer region 31 is formed to be extended from the carrier block D1 toward the interface block D4, and multiple rack units U are arranged in parallel with each other in the forward/backward direction at one side of the transfer region 31 (for example, at the left side when viewed from the front side). Further, at the other side of the transfer region 31 (for example, at the right side when viewed from the front side), a resist film forming module COT and a protective film forming module ITC as liquid processing modules configured to supply various kinds of chemical liquids to the surface of a wafer W being rotated and perform liquid processes on the wafer W are arranged in parallel with each other in the forward/backward direction.

The resist film forming module COT is configured to supply a resist on the wafer W and form a resist film on the wafer W. The protective film forming module ITC is configured to supply a preset processing liquid on the resist film and forms a protective film for protecting the resist film. Further, each rack unit U includes a non-illustrated heating module, and the transfer region 31 is provided with transfer arms F3 and F4 as transfer devices for the wafer W.

The other unit blocks B1, B2, B5, and B6 have substantially the same configuration as the unit blocks B3 and B4 except that different chemical liquids are supplied to the wafer W. The unit block B1 (B2) includes an anti-reflective film forming module BCT as a liquid processing module instead of the resist film forming module COT or the protective film forming module ITC, and the unit block B5 (B6) includes a developing module DEV. In FIG. 3, the transfer arms of the unit blocks B1 to B6 are expressed as F1 to F6, respectively.

At the front side in the processing block D3, a tower T1 vertically extended over the unit blocks B1 to B6 and a delivery arm 32 that is moved up and down to deliver the wafer W between multiple modules provided in the tower T1 are provided. In the tower T1, the multiple modules are vertically stacked, and among the modules, delivery modules TRS provided to correspond to heights of the respective unit blocks B1 to B6 are used to deliver wafers W to the transfer arms F1 to F6 in the unit blocks B1 to B6.

Specific examples of the modules provided in the tower T1 may include the above-described delivery modules TRS used to deliver the wafer W to the unit blocks B1 to B6, temperature control modules CPL configured to control temperatures of the wafers W, buffer modules BU configured to temporarily store multiple wafers W, and hydrophobic process modules ADH configured to perform a hydrophobic process on the surfaces of the wafers W. For simplicity of explanation, illustration of the hydrophobic process modules ADH, the temperature control modules CPL, and the buffer modules BU is omitted herein.

The interface block D4 includes towers T2, T3, and T4 vertically extended over the unit blocks B1 to B6 (FIG. 2 and FIG. 3). In the interface block D4, an interface arm 41 that is moved up and down to deliver the wafer W between the tower T2 and the tower T3, an interface arm 42 that is moved up and down to deliver the wafer W between the tower T2 and the tower T4, and an interface arm 43 that is moved up and down to deliver the wafer W between the tower T3 and the exposure device D5 are provided.

In the tower T2, delivery modules TRS, buffer modules BU configured to temporarily store multiple wafers W before being exposed, buffer modules BU configured to temporarily store the multiple wafers W after being exposed, and temperature control modules CPL configured to control temperatures of the wafers W are stacked. As is the case of the tower T1, illustration of the buffer modules BU and the temperature control modules CPL is omitted herein.

Further, in the tower T3 provided on the right of the tower T2 when viewed from the front side, multiple post-exposure cleaning modules PIR configured to perform a cleaning process on the wafer W after being exposed are vertically stacked. In the tower T4 provided on the left of the tower T2, multiple back surface cleaning modules BST configured to perform a back surface cleaning process on the wafer W before being loaded into the exposure device D5 are vertically stacked. Illustration of these modules is also omitted herein.

The coating and developing apparatus 1 having the configuration as described above in the present example embodiment includes the chemical liquid block D2 configured to accommodate multiple chemical liquid containers 50 in which chemical liquids to be supplied to the anti-reflective film forming modules BCT, the resist film forming modules COT, the protective film forming modules ICT, and the developing modules DEV serving as liquid processing modules are stored. Hereinafter, the detailed configuration of the chemical liquid block D2 will be explained.

The chemical liquid block D2 in the present example embodiment is provided within a housing partitioned from the atmosphere (external atmosphere) of a factory in which the coating and developing apparatus 1 is provided and from the other blocks D1 and D3. Further, the chemical liquid block D2 is provided along the arrangement direction of the carrier block D1 and the processing block D3 such that the front side of the chemical liquid block D2 and the rear side thereof are positioned between the carrier block D1 and the processing block D3.

The chemical liquid block D2 includes a tray mounting table 69 on which the chemical liquid container 50 loaded from the outside is mounted while being accommodated in a tray 51; multiple container mounting modules 6 constituting a container arrangement region where the chemical liquid containers 50 are provided to supply chemical liquids to the respective liquid processing modules; and a container transfer device 7 configured to transfer the chemical liquid container 50 between the tray mounting table 69 and each of the container mounting modules 6.

Figure 4:
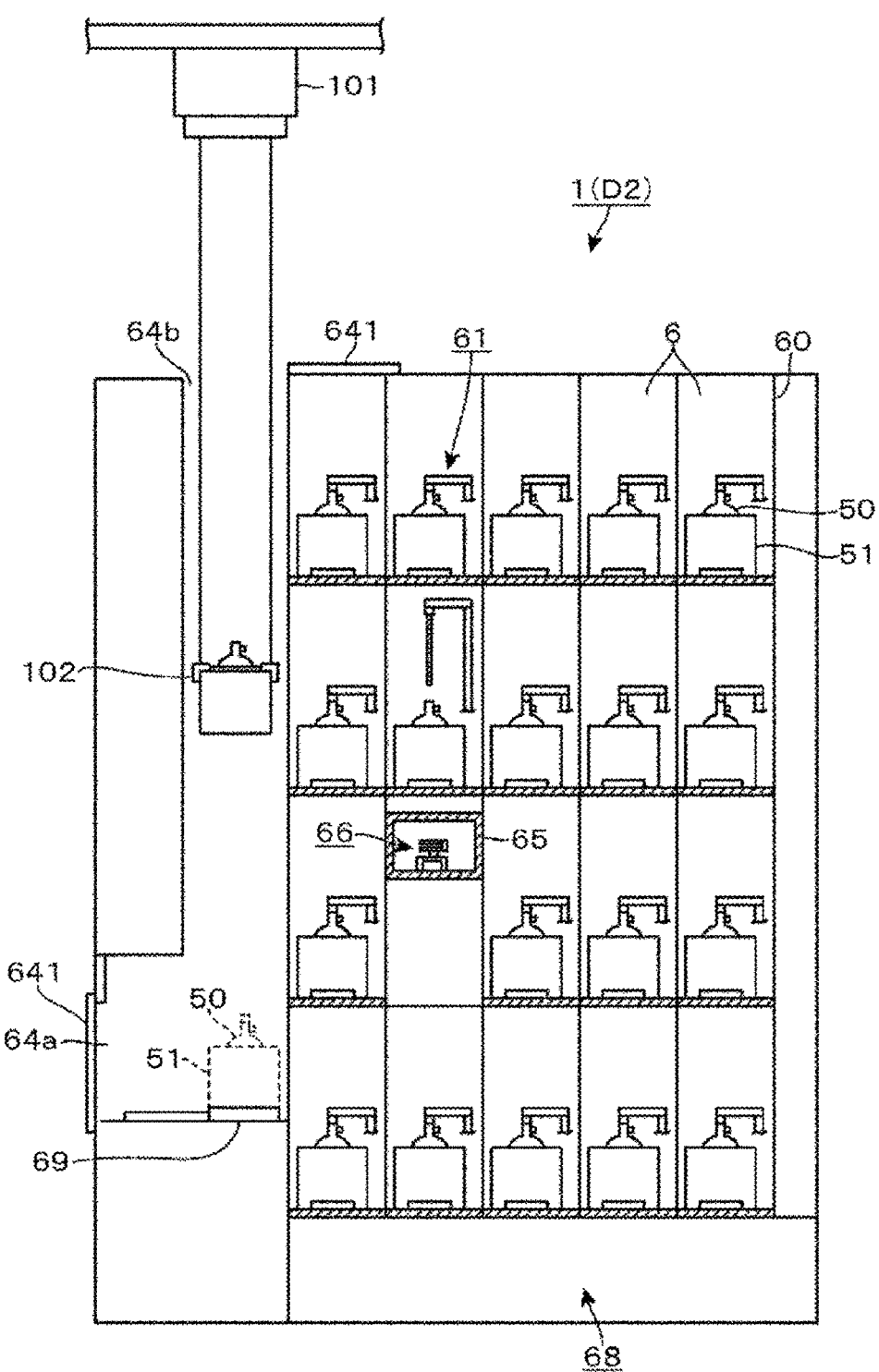
FIG. 4 is a longitudinal front view of a chemical liquid block provided in the coating and developing apparatus.

As depicted in FIG. 4, the tray mounting table 69 is formed on a side wall surface of the chemical liquid block D2 and provided to face a container loading/unloading opening 64a configured to be opened and closed by an opening/closing device 641. Further, the container loading/unloading opening 64a in the present example embodiment is formed at a side wall on the right of the chemical liquid block D2 when viewed from the front side, but the container loading/unloading opening 64a may also be formed at a side wall on the left thereof. The tray mounting table 69 may be horizontally moved between a position where the chemical liquid container 50 is loaded or unloaded through the container loading/unloading opening 64a by the operator and a position where the chemical liquid container 50 is delivered to the container transfer device 7.

Above the tray mounting table 69 moved to the position where the chemical liquid container 50 is delivered to the container transfer device 7, a container loading/unloading path 64b for vertically transferring the chemical liquid container 50 is formed. An upper end (loading/unloading opening) of the container loading/unloading path 64b is opened toward a ceiling surface of the chemical liquid block D2, and this opening can be opened and closed by the opening/closing device 641. At a ceiling portion of the factory in which the coating and developing apparatus 1 in the present example embodiment is installed, there is provided an OHT (Overhead Hoist Transport) 101 configured to transfer the chemical liquid container 50 along a rail track. The OHT 101 passes through the opening of the container loading/unloading path 64b and delivers the chemical liquid container 50 to the tray mounting table 69 moved to be under the opening of the container loading/unloading path 64b by moving a grasping device 102 up and down.

The tray mounting table 69, the container loading/unloading opening 64a, and the container loading/unloading path 64b constitute a loading/unloading port of the present example embodiment.

Figure 5:
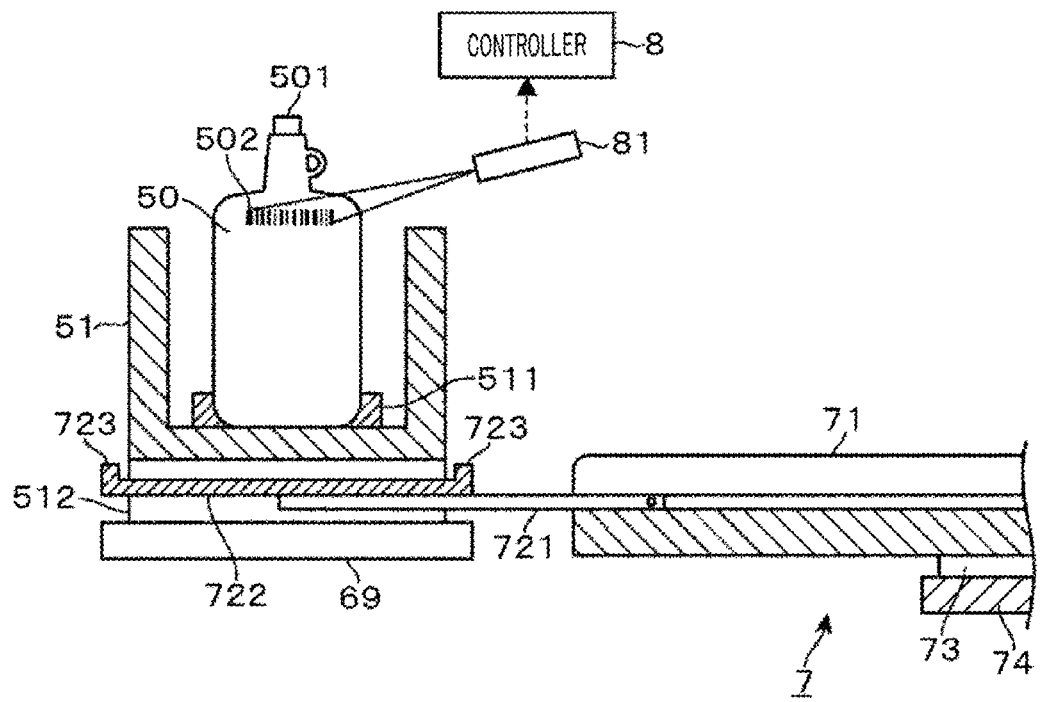
FIG. 5 is a first explanatory diagram of a container transfer device provided in the chemical liquid block.

The chemical liquid container 50 loaded into the chemical liquid block D2 through the container loading/unloading opening 64a or the container loading/unloading path 64b is accommodated in the tray 51. As depicted in FIG. 2 and FIG. 5, the tray 51 is a container having a hexahedral structure with an open top, and accommodates the main body of the chemical liquid container 50 which stores the chemical liquid. At a bottom portion within the tray 51, there is provided a container receiving portion 511 configured to fix the chemical liquid container 50 at preset position. Further, a non-illustrated grip portion is formed at a side surface of the tray 51, so that the grasping device 102 of the OHT 101 can grasp the tray 51 through the grip portion. Further, at the bottom portion under the tray 51, there is formed a notch 512 through which an arm 722 of the container transfer device 7 to be described later is inserted (see FIG. 5 and FIG. 7).

The chemical liquid container 50 is formed into a narrow neck bottle made of, for example, plastic or glass, and is loaded into the chemical liquid block D2 while its opening (chemical liquid suction opening) is sealed by a cover 501 formed of a screw cover or the like. On an outer surface of the main body of the chemical liquid container 50, a barcode 502 as identification information for identifying a kind of a chemical liquid stored in the chemical liquid container 50 is attached. Further, near the tray mounting table 69 moved to the position where the chemical liquid container 50 is delivered to the container transfer device 7, there is provided a barcode reader 81 as an acquisition device for acquiring information for identifying a chemical liquid. By reading the barcode 502 with the barcode reader 81, it is possible to identify a kind of a chemical liquid stored in the loaded chemical liquid container 50. This barcode 502 may be attached to the tray 51.

Herein, a method of acquiring identification information for identifying a kind of a chemical liquid is not limited to combination of the barcode 502 and the barcode reader 81. An IC tag may be attached to the chemical liquid container 50 or the tray 51, and a communication device configured to acquire identification information by conducting communication with the IC tag may be provided near the tray mounting table 69.

As depicted in FIG. 2 and FIG. 5, the container transfer device 7 configured to transfer the chemical liquid container 50 has a configuration in which two pair of arms (a first arm 721 and a second arm 722) configured to hold the chemical liquid container 50 are provided at a main body 71. The first and second arms 721 and 722 are provided on an upper surface side of the main body 71 while being connected to each other, and each of the arms 721 and 722 is extended from the main body 71 and configured to be extensible and contractible between a position where the chemical liquid container 50 is delivered to the tray mounting table 69 or the container mounting module 6 and a position where the chemical liquid container 50 is transferred on the main body 71 by folding the arms 721 and 722. Further, at a front end portion and a rear end portion of the first arm 721 in an extension direction, there are provided tray guides 723 configured to regulate a position of holding the tray 51 from the front side and the rear side in order to suppress the position deviation of the tray 51 during the transferring thereof.

The main body 71 is held on a supporting member 74 via a rotation shaft 73 and configured to be rotated around a vertical axis. As a result, the extension direction of each of the arms 721 and 722 can be changed between a direction (indicated by a solid line in FIG. 2) in which the chemical liquid container 50 is delivered to the tray mounting table 69 and a direction (indicated by a dashed line in FIG. 2) in which the chemical liquid container 50 is delivered to the respective container mounting modules 6.

Further, as depicted in FIG. 2 and FIG. 3, the supporting member 74 configured to hold the main body 71 is supported by two elevating rails 751 vertically extended, and upper end portions and lower end portions of the elevating rails 751 are supported by a moving rail 752 horizontally extended along the vicinity of a ceiling portion and the vicinity of a bottom portion of the chemical liquid block D2. Furthermore, since the supporting member 74 is configured to be vertically moved and the elevating rails 751 are configured to be horizontally moved by a non-illustrated driving device provided at the elevating rails 751 and the moving rail 752, the main body 71 can be moved to any position on the inner wall surface of the chemical liquid block D2. A region where the container transfer device 7 (main body 71) is moved between the tray mounting table 69 and the respective container mounting modules 6 becomes a transfer region for the chemical liquid container 50.

Figure 6:
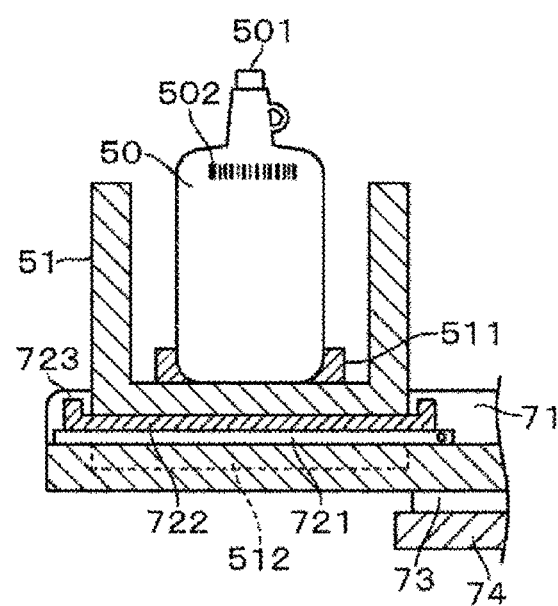
FIG. 6 is a second explanatory diagram of the container transfer device.

The container transfer device 7 puts a mounting region for the tray 51 positioned between the tray guides 723 provided at the front end and the rear end of the second arm 722 into a space under the tray 51 through the above-described notch 512, and receives the chemical liquid container 50 from the tray mounting table 69 or the container mounting module 6 by raising the second arm 722 (FIG. 5). Then, by folding the first and second arms 721 and 722, the chemical liquid container 50 is transferred while the tray 51 is arranged on the main body 71 (FIG. 6). Further, in the main body 71, there is formed a groove configured to avoid interference with a lower end portion of a side wall of the tray 51 downwardly extending from the right and left positions of the notch 512 (see, for example, a groove 711 depicted in FIG. 12 in accordance with a modification example of the container transfer device 7).

At a region facing an inner wall surface of the chemical liquid block D2 where the container transfer device 7 is vertically and horizontally moved, there is provided a container rack 60 as a container arrangement section in which the multiple container mounting modules 6 are partitioned from each other, and vertically and horizontally arranged in parallel with each other in a grid pattern (FIG. 4). In the present example embodiment, the container rack 60 includes four plates vertically stacked, and on each of the plates, five container mounting modules 6 are horizontally arranged. In the container rack 60, except a position where a wafer transfer path 65 to be described later is formed, a total of 19 container mounting modules 6 are provided. As depicted in FIG. 2, the container rack 60 is arranged toward a direction orthogonal to the arrangement direction (forward/backward direction) of the carrier block D1 and the processing block D3 such that the container mounting modules 6 on each plate are arranged side by side when viewed from the front side.

In the coating and developing apparatus 1, various kinds of resist liquids having different concentrations or components are separately used, and various kinds of chemical liquids, such as a developing liquid used for developing a resist film after the exposure, a thinner used for making it easy to spread a resist liquid on the surface of a wafer, and a raw material liquid used for forming an anti-reflective film or a protective film on an upper surface or a lower surface of the resist film, are also used. Each of the container mounting modules 6 in the container rack 60 is an arrangement position for each of the chemical liquid containers 50 in which these various chemical liquids are stored. Further, when any one of the chemical liquid containers 50 runs out of its chemical liquid, in order to continuously supply the corresponding chemical liquid from another chemical liquid container 50, the chemical liquid container 50 which stores the corresponding chemical liquid of the same kind is arranged in one of the multiple container mounting modules 6, and the chemical liquid container 50 may be replaced to supply the chemical liquid.

Figure 7:
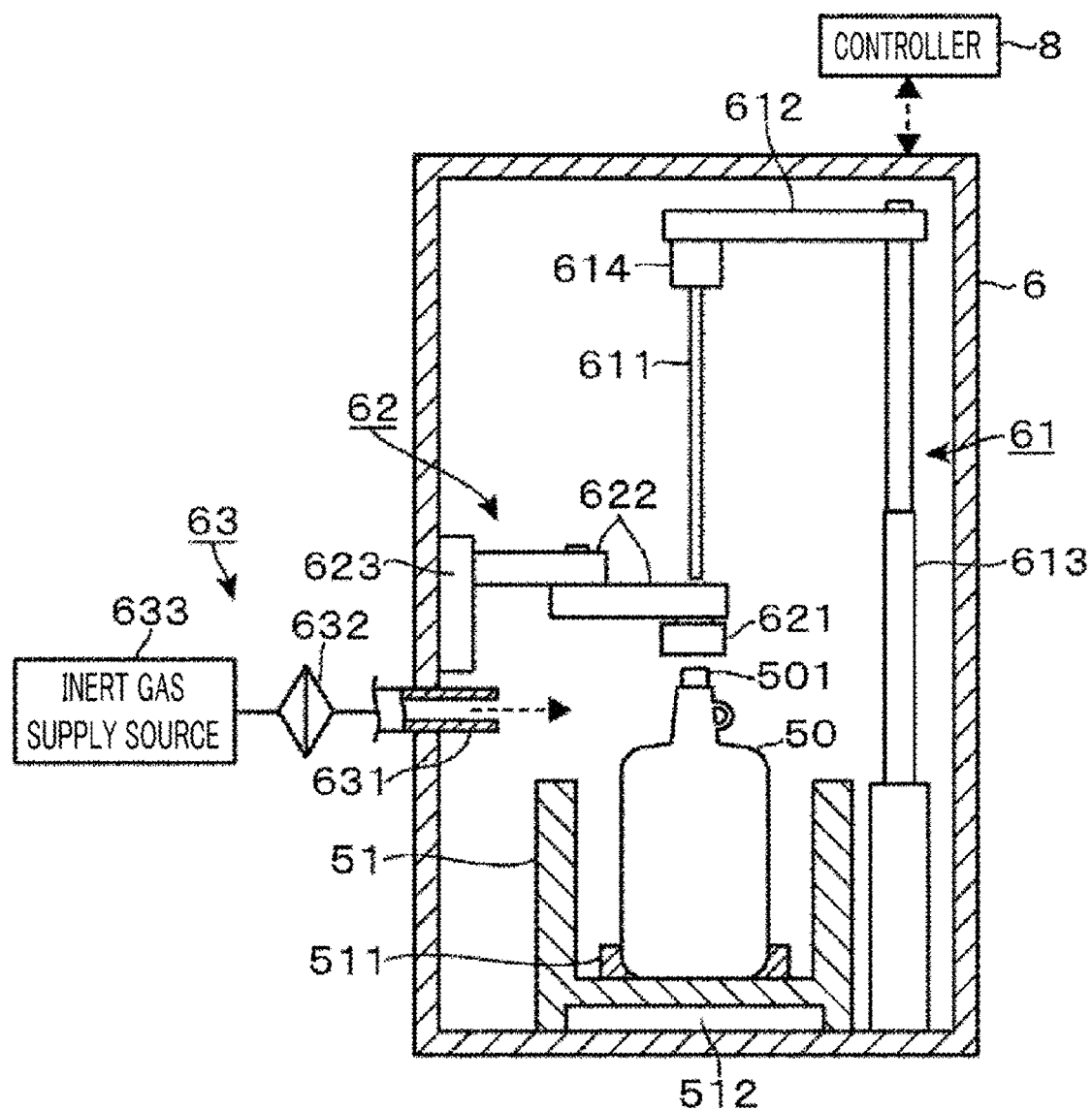
FIG. 7 is a first explanatory diagram of a container mounting module provided in the chemical liquid block.
Figure 8:
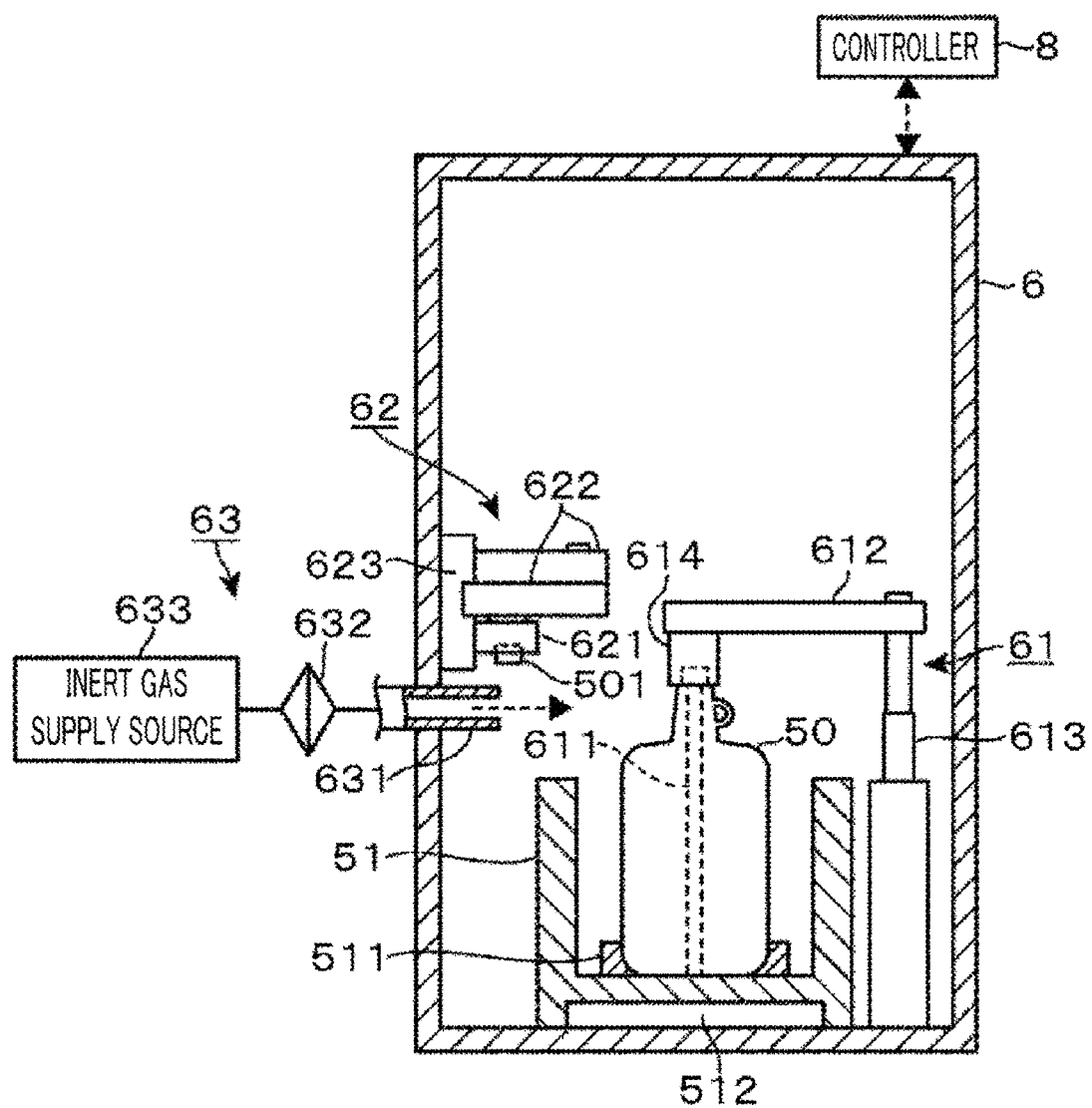
FIG. 8 is a second explanatory diagram of the container mounting module.

As depicted in FIG. 7 and FIG. 8, each container mounting module 6 has an open front surface facing the container transfer device 7 and is provided within a partitioned rack, and includes a suction nozzle 611 constituting a base end side of a chemical liquid supply path to the liquid processing module; a nozzle attachment/detachment device 61 configured to attach and detach the suction nozzle 611 with respect to the chemical liquid container 50; a cover opening/closing device 62 configured to open and close the cover 501 that seals the chemical liquid container 50; and an inert gas supply device 63 configured to supply an inert gas into a space within the container mounting module 6.

The nozzle attachment/detachment device 61 includes a supporting arm 612 horizontally extended and an elevating device 613. The supporting arm 612 is configured to support an upper end of the suction nozzle 611 which is downwardly extended. The suction nozzle 611 is made of a resin or a metal, and is formed into a narrow tube of which a lower end is open. The elevating device 613 is vertically extensible and contractible, and is configured to support a base end of the supporting arm 612 opposite to a portion where the suction nozzle 611 is supported.

The suction nozzle 611 has a length that enables the lower end having an opening to approach the vicinity of the bottom surface of the chemical liquid container 50 when the suction nozzle 611 is inserted into the chemical liquid container 50, and is configured as a straw capable of sucking almost all of a chemical liquid stored within the chemical liquid container 50. When the suction nozzle 611 is inserted into the chemical liquid container 50, the suction nozzle 611 closes an opening of the chemical liquid container 50 by pressing the opening from an upper surface side, and is held by the supporting arm 612 via a holding member 614 made of, for example, rubber. The elevating device 613 is configured to move the supporting arm 612 up and down, so that the suction nozzle 611 is moved between a withdrawal position (FIG. 7) where the entire suction nozzle 611 is retreated to an upper side of the opening of the chemical liquid container 50 and an insertion position (FIG. 8) where the suction nozzle 611 is inserted into the chemical liquid container 50.

The cover opening/closing device 62 includes an opening/closing device 621 configured to open and close the cover 501; a supporting arm 622 configured to hold the opening/closing device 621; and an elevating device 623 configured to move the supporting arm 622 up and down.

The opening/closing device 621 is a member having an opening, and an outer peripheral surface of the cover 501, which seals the chemical liquid container 50, is closely inserted and fitted into the opening of the opening/closing device 621. Further, the opening/closing device 621 is held by a front end of the supporting arm 622 with the opening thereof downward. The opening/closing device 621 is configured to be rotated around a vertical axis by a non-illustrated driving device provided within the supporting arm 622 in a direction in which the cover 501 is opened and closed.

The supporting arm 622 in the present example embodiment includes a base-side arm supported by the elevating device 623 and a front end-side arm configured to hold the opening/closing device 621, which are connected to each other via a rotation shaft vertically extended. Thus, the opening/closing device 621 can be moved between an opening/closing position (FIG. 7) where the opening/closing device 621 provided to face the upper end of the chemical liquid container 50 opens and closes the cover 501 and a retreat position (FIG. 8) where the opening/closing device 621 is retreated to a side from the opening/closing position in order to avoid interference with an operation of attaching and detaching the suction nozzle 611 by the nozzle attachment/detachment device 61. Further, when moved to the retreat position, the opening/closing device 621 carries the separated cover 501.

Further, in the cover opening/closing device 62 in the present example embodiment, the elevating device 623 is provided at, for example, the surface of a partition wall that partitions the adjacent container mounting modules 6. Further, the elevating device 623 is configured to downwardly move the opening/closing device 621 located to the opening/closing position in order for the cover 501 to be inserted and fitted into the opening/closing device 621 or is configured to move the opening/closing device 621 up and down according to the movement of the cover 501 when the cover 501 is opened and closed.

The inert gas supply device 63 includes an inert gas supply line 631 of which an opening faces the region where the cover 501 is opened and closed by the opening/closing device 621; a filter 632 provided on the inert gas supply line 631 and configured to remove particles in an inert gas to be supplied to the container mounting module 6; and an inert gas supply source 633 provided at a base end of the inert gas supply line 631 and configured to supply an inert gas such as a nitrogen gas or an argon gas.

The inert gas supply line 631 supplies an inert gas toward the opening of the chemical liquid container 50 in order to suppress air from being introduced into the opened chemical liquid container 50 during the opening and closing of the cover 501. As depicted in FIG. 8, if the opening of the chemical liquid container 50 is closed by the holding member 614 when the suction nozzle 611 is inserted into the chemical liquid container 50, the nozzle attachment/detachment device 61 may be provided with a device configured to supply an inert gas into the chemical liquid container 50 in order for the chemical liquid container 50 not to have a vacuum atmosphere therein due to the suction of the chemical liquid.

Further, if a pressure within the chemical liquid container 50 is maintained by introducing an ambient gas through the opening thereof without closing the opening of the chemical liquid container 50, after allowing the inside of the container mounting module 6 to be sealable by providing an opening/closing door (shutter) at a front end of the container mounting module 6, the chemical liquid may be sucked while supplying an inert gas into the partitioned region.

The filter 632 includes a gas filter such as a HEPA (High Efficiency Particulate Air) filter within a filter cartridge. Further, the inert gas supply source 633 includes a gas reservoir in which an inert gas is stored; and a flow rate controller, so that the inert gas supply source 633 can control supply of the inert gas or a flow rate of the inert gas. By way of example, the inert gas supply source 633 may be a common source for multiple inert gas supply lines 631 respectively supplying the inert gas to the container mounting modules 6.

Herein, it is not required to provide the inert gas supply device 63 with respect to all of the container mounting modules 6. By way of example, the inert gas supply device 63 may not be provided in the container mounting module 6 where the chemical liquid container 50, which stores a chemical liquid having less deterioration caused by being contacted with air and a smaller effect caused by supplying the inert gas, is arranged.

Figure 9:
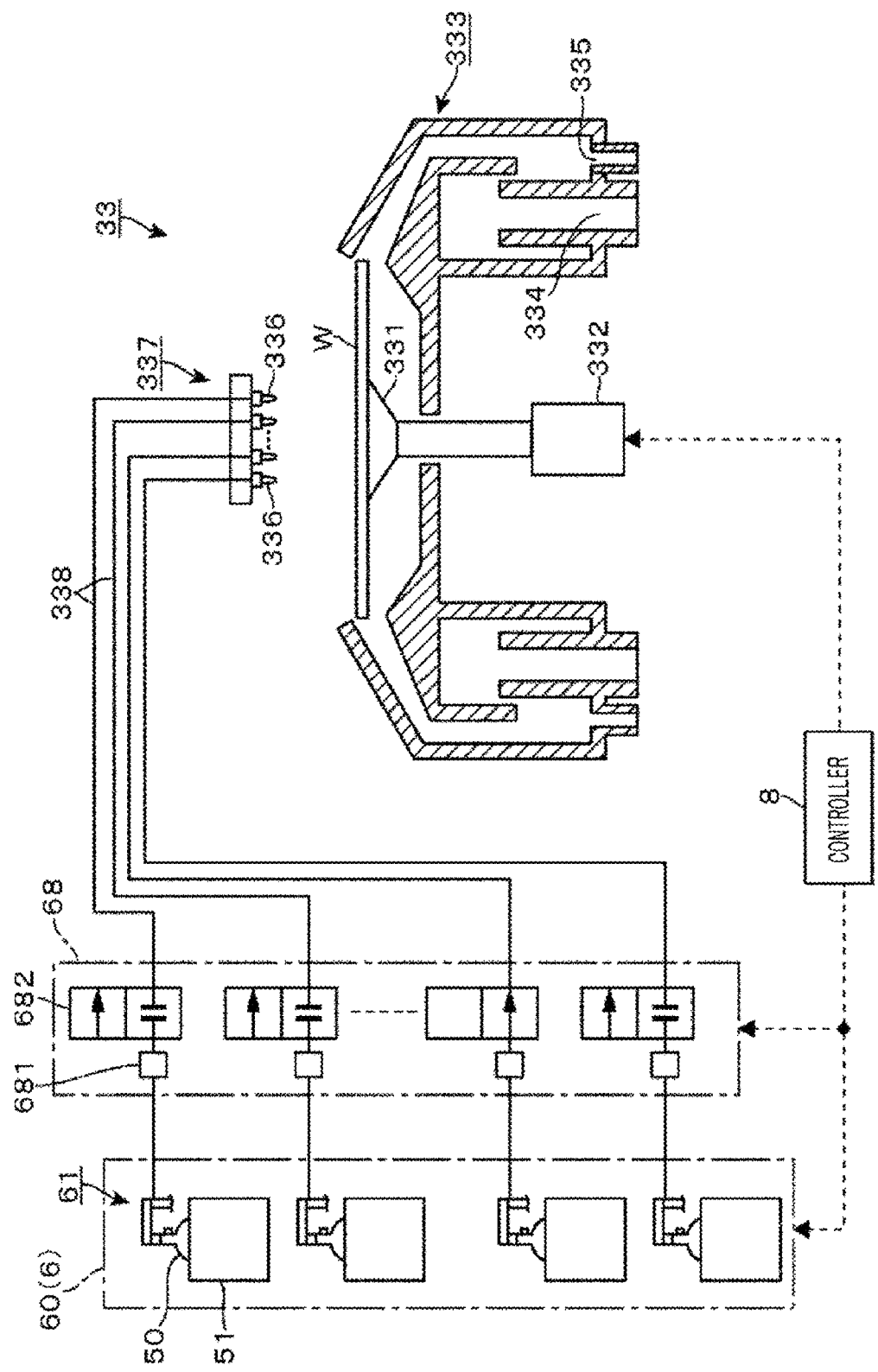
FIG. 9 is an explanatory diagram illustrating a chemical liquid supply path in a chemical liquid nozzle.

FIG. 9 illustrates chemical liquid supply paths 338 from the chemical liquid containers 50 provided with the suction nozzles 611 to chemical liquid nozzles 336 of each of liquid processing modules 33. Each of the chemical liquids is sucked from the chemical liquid container 50 arranged in the container mounting module 6 by a chemical liquid pump 681 provided at the chemical liquid supply path 338, and then, supplied to the chemical liquid nozzle 336. At a downstream side of the chemical liquid pump 681, an opening/closing valve 682 is provided, and by driving the opening/closing valve 682, the supply of the chemical liquid to each chemical liquid nozzle 336 is controlled. The chemical liquid pumps 681 and the opening/closing valves 682 provided at the chemical liquid supply paths 338 are arranged together in a pump arrangement section 68 depicted in FIG. 3 and FIG. 4, and the chemical liquids sucked from the chemical liquid containers 50 are supplied toward the liquid processing modules 33 in the respective layers B1 to B6 by the chemical liquid pumps 681 arranged in the pump arrangement section 68.

An overview of the liquid processing module 33 will be explained. The nozzle arm 337 holds one or more chemical liquid nozzles 336 in order to supply one or more kinds of chemical liquids depending on a liquid process performed by the liquid processing module 33. Further, the chemical liquids are supplied in sequence in a preset amount from the chemical liquid nozzles 336 to the surface of each wafer W held on a spin chuck 331 being rotated around a vertical axis by a rotation driving device 332, so that a liquid process can be performed on each wafer W. The chemical liquids scattered from the wafer W being rotated are received by a cup body 333 provided around the spin chuck 331 and drained out to the outside through a liquid drain opening 335. Further, an air flow introduced into the cup body 333 is discharged through an exhaust opening 334.

Herein, the chemical liquids from the chemical liquid containers 50 accommodated in the chemical liquid block D2 may be supplied to, for example, a hydrophobic processing gas generation device configured to supply a hydrophobic processing gas to the hydrophobic process modules ADH that performs a hydrophobic process on the surface of the wafer W as well as the above-described liquid processing modules 33.

An amount of the chemical liquid within each of the chemical liquid containers 50 mounted on the container mounting modules 6 is monitored by, for example, a non-illustrated liquid level meter provided within the container mounting module 6 or a non-illustrated flowmeter provided at the chemical liquid supply path 338. In the example embodiment, if an amount of the chemical liquid within the chemical liquid container 50 is lower than a preset level of a liquid surface, or if a preset flow rate is not detected even when the opening/closing valve 682 is connected to the chemical liquid nozzle 336 by driving the chemical liquid pump 681, the chemical liquid container 50 is determined to be replaced.

Further, at the ceiling portion of the coating and developing apparatus 1, there is provided a FFU (Fan Filter Unit) 67, and a downward flow of clean air can be formed within each of the blocks D1 to D4 of the coating and developing apparatus 1. Further, as depicted in FIG. 3, the FFU 67 forms the downward flow of the clean air within the housing constituting the chemical liquid block D2. By opening and closing the cover 501 and by attaching and detaching the suction nozzle 611 under this atmosphere, it is possible to suppress the chemical liquid from being mixed with contaminants such as particles. From this point of view, the FFU 67 corresponds to a clean gas supply device of the present example embodiment.

As described herein, the chemical liquid block D2 is arranged between the carrier block D1 and the processing block D3. For this reason, the wafer W unloaded from the carrier block D1 or the wafer W processed in the processing block D3 is transferred to the blocks D3 and D1 as transfer target positions through the chemical liquid block D2.

Within the chemical liquid block D2 where the covers 501 of the chemical liquid containers 50 which store various kinds of chemical liquids are opened and closed, the chemical liquids or their solvents can be volatilized. Thus, it is not desirable to expose the wafer W before or after being processed under an atmosphere in which multiple kinds of chemical liquids are likely to float. Further, since a transfer device configured to transfer the wafers W is frequently moved between the blocks D3 and D1 together with the container transfer device 7, particles may be generated and the inside of the chemical liquid block D2 may be contaminated, which is not desirable.

Therefore, as depicted in FIG. 3 and FIG. 4, in the chemical liquid block D2 of the present example embodiment, a square tube-shaped wafer transfer path 65 connecting the carrier block D1 to the processing block D3 is provided to pass through the chemical liquid block D2 in a horizontal direction. In the wafer transfer path 65, there is formed a space surrounded by a square tube-shaped cylindrical member, which is partitioned from the atmosphere within the chemical liquid block D2 and from the atmospheres of the other blocks D1 and D3. Within the wafer transfer path 65, there is provided a shuttle arm 66, which transfers the wafer W between the both blocks D1 and D3. The shuttle arm 66 transfers the wafer W between the transfer arm 23 of the carrier block D1 and the delivery modules TRS0 provided in the tower T1 within the processing block D3.

The wafer transfer path 65 is provided to be horizontally extended from the delivery module TRS0 toward the carrier block D1 at the front side. For this reason, at a position where the wafer transfer path 65 passes through the container rack 60, the container mounting module 6 is not provided (FIG. 4).

Further, in order to avoid interference with the elevating rails 751 horizontally moved along the extension direction of the moving rail 752, a notch 651 is provided at the wafer transfer path 65 to allow the elevating rails 751 to pass therethrough (FIG. 3). The notch 651 has a small width such that the elevating rails 751 are allowed to be passed through and contamination with the above-described chemical liquid components or particles generated from the shuttle arm 66 by mixing the atmospheres within the wafer transfer path 65 and the chemical block D2 is not a problem. Further, in order for these atmospheres not to be mixed with each other, an air curtain may be formed by allowing clean air to flow from one side of a notch surface of the wafer transfer path 65 where the notch 651 is provided toward the other side.

The coating and developing apparatus 1 having the above-described configuration is connected with a controller 8 as depicted in FIG. 2, FIG. 5, FIG. 7, and FIG. 9. The controller 8 may be formed of a computer including a CPU and a storage device, and the storage device stores a program including a process (instruction) group for an operation of the coating and developing apparatus 1, i.e., transfer of the wafer W or processes on the wafer W in each of the blocks D1 to D4, transfer of the chemical liquid container 50 within the chemical liquid block D2, or transfer of the chemical liquid container 50 toward the correct container mounting module 6 and replacement of the completely used chemical liquid container 50 based on the information read from the barcode 502 by the barcode reader 81 when the chemical liquid container 50 is transferred or the chemical liquid container 50 of the container mounting module 6 is replaced within the chemical liquid block D2. This program may be stored in a storage medium, such as a hard disc, a compact disc, a magneto optical disc, and a memory card, and is installed in the computer.

In particular, regarding the transfer of the chemical liquid container 50 in the chemical liquid block D2, information for identifying multiple container mounting modules 6 (mounting positions of the chemical liquid containers 50) provided in the container rack 60 and information on the kinds of chemical liquids stored in the chemical liquid containers 50 to be arranged in the respective container mounting modules 6 are matched with each other in advance to be stored in the controller 8. Further, a matching relation between the information read from the barcode 502 by the barcode reader 81 and the information on the kinds of chemical liquids is also stored. Based on the these information, when the chemical liquid container 50 in the container mounting module 6 needs to be replaced, another chemical liquid container 50 that stores which one of the chemical liquids is determined to be transferred to the corresponding container mounting module 6. As a result, a transfer target position for the chemical liquid container 50 transferred by the container transfer device 7 can be specified. From this point of view, the controller 8 may constitute a transfer control controller that controls a transfer target position or whether or not to transfer the chemical liquid container 50 by the container transfer device 7.

Hereinafter, an operation of the coating and developing apparatus 1 in accordance with the present example embodiment will be explained. Further, for the convenience of explanation, in some cases, explanation of some processes such as a process in a non-illustrated module may be omitted.

The wafers W are unloaded one by one from the carrier C, and then, delivered by the transfer arm 23 to the shuttle arm 66 within the wafer transfer path 65. After the wafer W is transferred to the inside of the wafer transfer path 65, the wafer W is mounted on the delivery module TRS0. The wafer W on the delivery module TRS0 is delivered to the BCT layer B1 or B2 through the delivery module TRS1 or TRS2, respectively, by the delivery arm 32.

The wafer W loaded into the BCT layer B1 or B2 is processed while being transferred in sequence of the anti-reflective film forming module, the heating module and the TRS1 or TRS2, respectively, and then transferred to the COT layer B3 or B4 through the delivery module TRS3 or TRS4, respectively, by the delivery arm 32.

The wafer W loaded into the COT layer B3 or B4 is processed while being transferred in sequence of the resist film forming module, the heating module, the protective film forming module (ITC), the heating module, and the delivery module TRS of the tower T2.

The wafer W loaded into the delivery module TRS of the tower T2 is transferred into a non-illustrated buffer module SBU. Then, after, the wafer W is loaded into the back surface cleaning module BST of the tower T4 by the interface arm 42, a back surface cleaning process is performed on the wafer W. The wafer W on which the back surface cleaning process is performed is loaded into the exposure device D5 through the temperature control module CPL (not illustrated) of the tower T2 by the respective interface arms 42, 41, and 43.

The wafer W after being exposed is loaded from the delivery module TRS of the tower T2 to the post-exposure cleaning modules PIR of the tower T3 by the interface arms 43 and 41. After being cleaned, the wafer W is delivered to the DEV layer B5 or B6 through the delivery module TRS5 or TRS6 of the tower T2.

The wafer W loaded into the DEV layer B5 or B6 is processed while being transferred in sequence of the heating module, the developing module, the heating module, and the delivery module TRS of the tower T1. After the wafer W is moved to and mounted on the delivery module TRS0 for the delivery with respect to the carrier block D1, the wafer W is transferred within the wafer transfer path 65 by the shuttle arm 66 and returned back to the carrier C by the transfer arm 23.

Figure 10:
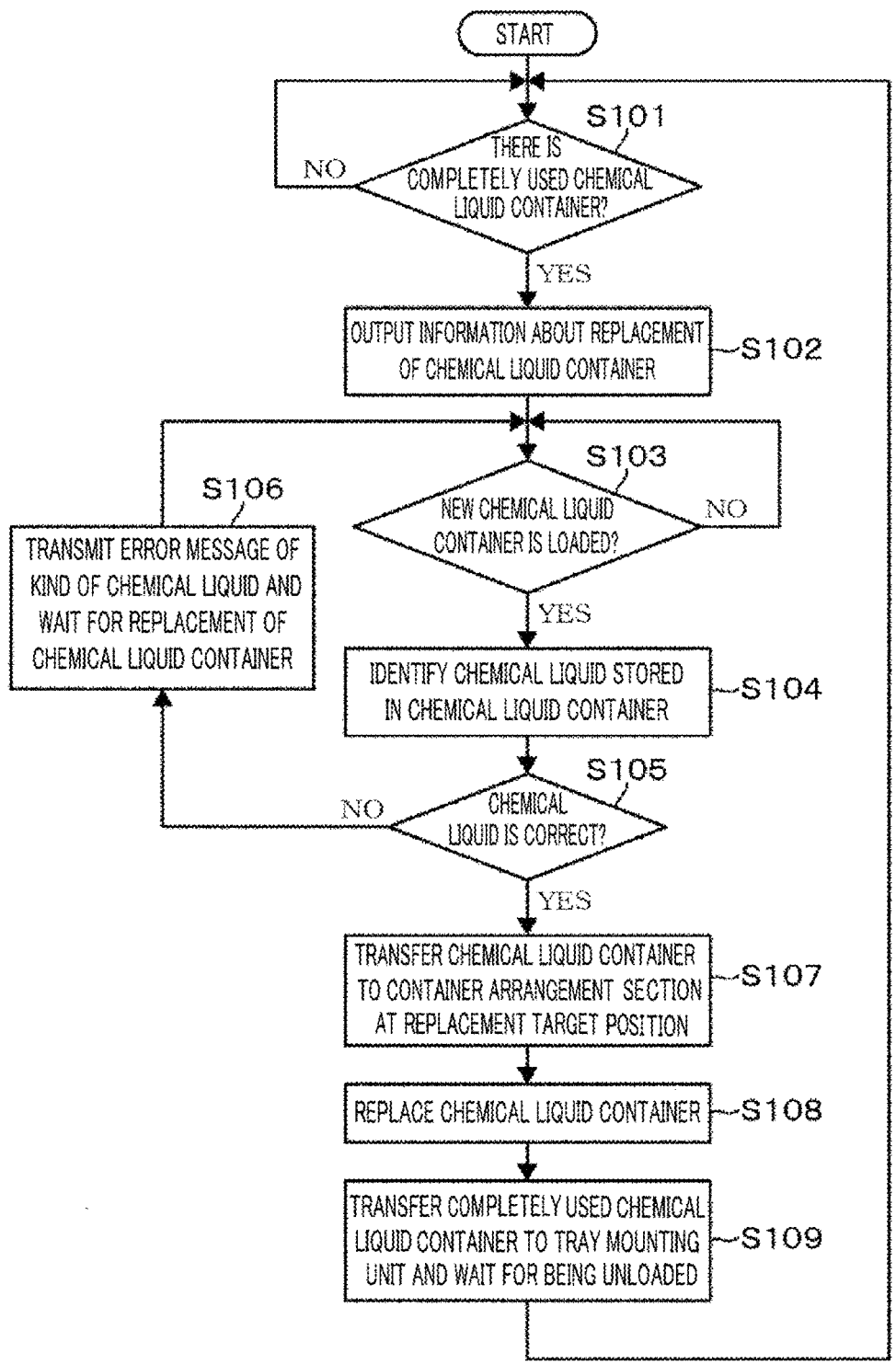
FIG. 10 is a flowchart of an operation of replacing a chemical liquid container in the chemical liquid block.

While the operations of transferring and processing the wafers W are performed, the operation of loading and unloading the chemical liquid container 50 or the operation of replacing the chemical liquid container 50 in the container mounting module 6 is performed within the chemical liquid block D2. Hereinafter, these operations will be explained with reference to the flowchart of FIG. 10.

As depicted in FIG. 4, the chemical liquid container 50 are arranged in each of the container mounting modules 6 of the container rack 60, and the chemical liquid container 50 connected to each of the liquid processing modules 33 supplies the chemical liquid according to a status of the liquid process (Start). Herein, a process of monitoring a liquid surface level of the chemical liquid in the chemical liquid container 50 within each of the container mounting modules 6 and detecting whether or not there is a completely used chemical liquid container 50 (block S101) is carried out, and if there is no completely used chemical liquid container 50, the monitoring process is continuously performed (block S101; NO).

If a completely used chemical liquid container 50 is detected (block S101; YES), information that the chemical liquid container needs to be replaced and information on the kind of the chemical liquid is outputted (block S102). By way of example, the outputted information is transmitted to the operator as being displayed on a non-illustrated panel display provided at an outer wall surface of the coating and developing apparatus 1, or the information that the chemical liquid container needs to be replaced and the information on the kind of the chemical liquid is outputted to a host computer that manages the apparatuses in the factory.

As a result, a new chemical liquid container 50 is loaded into the chemical liquid block D2 through the container loading/unloading opening 64*a* by the operator, or a new chemical liquid container 50 is loaded through the container loading/unloading path 64*b* by the OHT 101 instructed by the host computer.

During this period, the coating and developing apparatus 1 waits for the new chemical liquid container 50 (block S103) and maintains a standby state until the loading of the new chemical liquid container 50 is detected (block S103; NO).

If the loading of the new chemical liquid container 50 is detected (block S103; YES), the barcode 502 of the chemical liquid container 50 is read by the barcode reader 81, a kind of the chemical liquid stored in the chemical liquid container 50 is identified, and the loading of the correct chemical liquid container 50 is confirmed (block S104). Then, the kind of the chemical liquid set for the container mounting module 6 where the completely used chemical liquid container 50 is arranged is compared with the kind of the chemical liquid stored in the new chemical liquid container 50.

As a result, if the chemical liquid container 50 storing the correct chemical liquid is not loaded (block S105; NO), an error message of the kind of the chemical liquid is transmitted to the panel display or the host computer, and the completely used chemical liquid container 50 still waits for being replaced (block S106). If a new chemical liquid container 50 is loaded (block S103; YES), a kind of the chemical liquid stored in the new chemical liquid container 50 is repeatedly identified (block S104).

If the chemical liquid container 50 storing the correct chemical liquid is loaded (block S105; YES), the container transfer device 7 receives the chemical liquid container 50 from the tray mounting table 69 and transfers the chemical liquid container 50 toward the container mounting module 6 where the replacement target is arranged (block S107). In this case, the container transfer device 7 is moved toward the container mounting module 6 for the replacement target while avoiding interference with the wafer transfer path 65 depicted in FIG. 3 and FIG. 4.

In the container mounting module 6 for the replacement target, the suction nozzle 611 is separated from the completely used chemical liquid container 50, and the corresponding chemical liquid container 50 is in a standby state while being assembled with the cover 501 by the cover opening/closing device 62 (FIG. 7). The container transfer device 7 moved to the container mounting module 6 controls the first and second arms 721 and 722, which do not hold the chemical liquid container 50, to face the corresponding container mounting module 6 and receive the completely used chemical liquid container 50 from the container mounting module 6. Then, the main body 71 is rotated, the first and second arms 721 and 722, which hold the newly loaded chemical liquid container 50, are arranged to face the container mounting module 6, and the new chemical liquid container 50 is delivered to the container mounting module 6. In the container mounting module 6, the cover 501 is separated by the cover opening/closing device 62 and moved to the retreat position, and then, the suction nozzle 611 is inserted. As such, the replacement of the chemical liquid container 50 is completed (block S108, FIG. 8).

Then, the completely used chemical liquid container 50 is transferred to the tray mounting table 69 by the container transfer device 7 and waits for being unloaded (block S109), and the corresponding chemical liquid container 50 is unloaded to the outside by the operator or the OHT 101.

If the completely used chemical liquid container 50 is replaced with the new chemical liquid container 50 through the above-described operations, whether or not there are any other chemical liquid containers 50, which is completely used, is continuously monitored (block S101).

The coating and developing apparatus 1 in accordance with the present example embodiment has the following effects. The container rack 60 (container mounting section) includes multiple container mounting modules 6 where the chemical liquid containers 50 are arranged, the chemical liquid container 50 in the container rack 60 is replaced using the container transfer device 7. Further, the operation of attaching and detaching the suction nozzle 611 is performed by the nozzle attachment/detachment device 61 in each container mounting module 6. Therefore, it is possible to provide the container rack 60 within the chemical liquid block D2 partitioned from the external atmosphere and replace the chemical liquid container 50 without using the operator's hands. Further, a used chemical liquid container 50 is replaced with a new chemical liquid container 50 between the container rack 60 (container arrangement section) and the tray mounting table 69 (loading/unloading port) using the container transfer device 7 configured to automatically replace the chemical liquid containers. For this reason, the plates of the container rack 60 are arranged such that the multiple chemical liquid containers 50 are arranged in parallel with each other toward the direction orthogonal to the arrangement direction of the carrier block D1 and the processing block D3 arranged in a row. Accordingly, it is possible to replace the chemical liquid container 50 even if it is difficult to perform the operation with the operator's hands. As a result thereof, it is possible to suppress contaminants such as particles from being mixed into the chemical liquid container 50, and also possible to reduce deterioration of the chemical liquid by supplying the inert gas into the container mounting module 6.

Further, the container rack 60 or the container transfer device 7 may be arranged at a portion where the operator is difficult to be entered, so that it is possible to suppress the increase in a footprint of the coating and developing apparatus, which caused by providing the chemical liquid block D2. In this case, as a maintenance of the container mounting modules 6 or the container transfer device 7, the chemical liquid blocks D2 may be unloaded toward any one direction of the right and left directions when viewed from the front side, or the carrier block D1 or the processing block D3 may be separated from the chemical liquid block D2.

Figure 11:
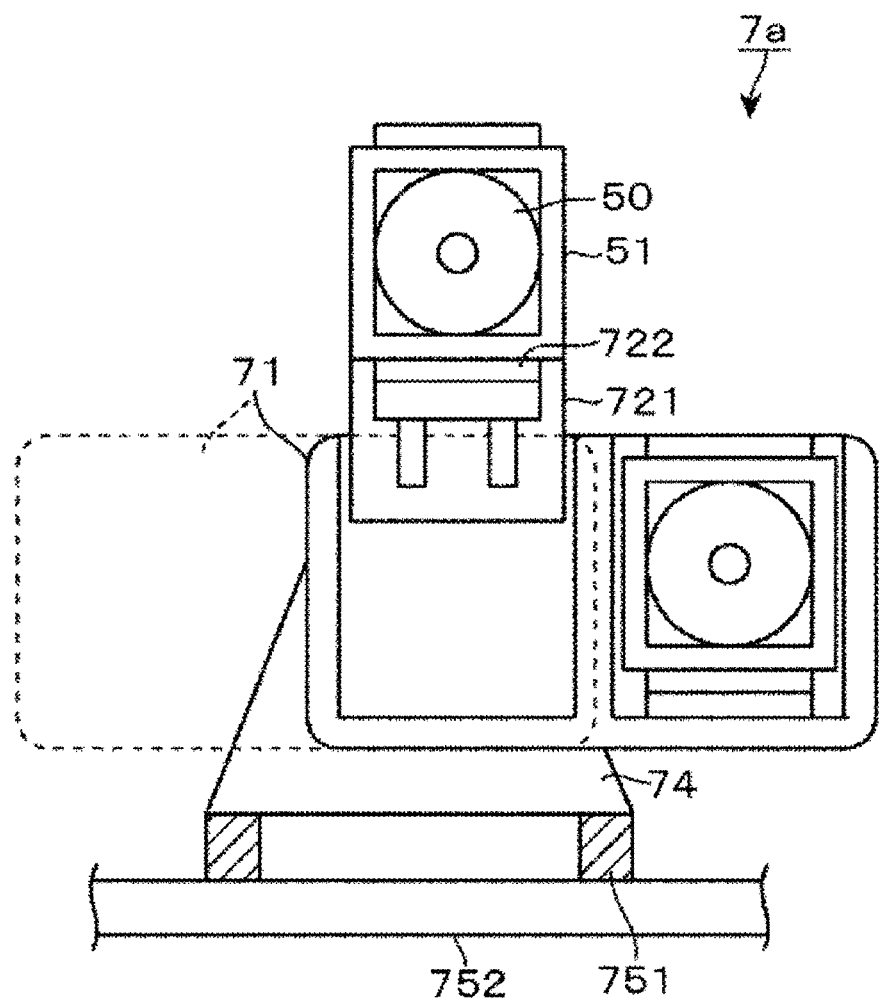
FIG. 11 is a plane view illustrating another example of the container transfer device.
Figure 12:
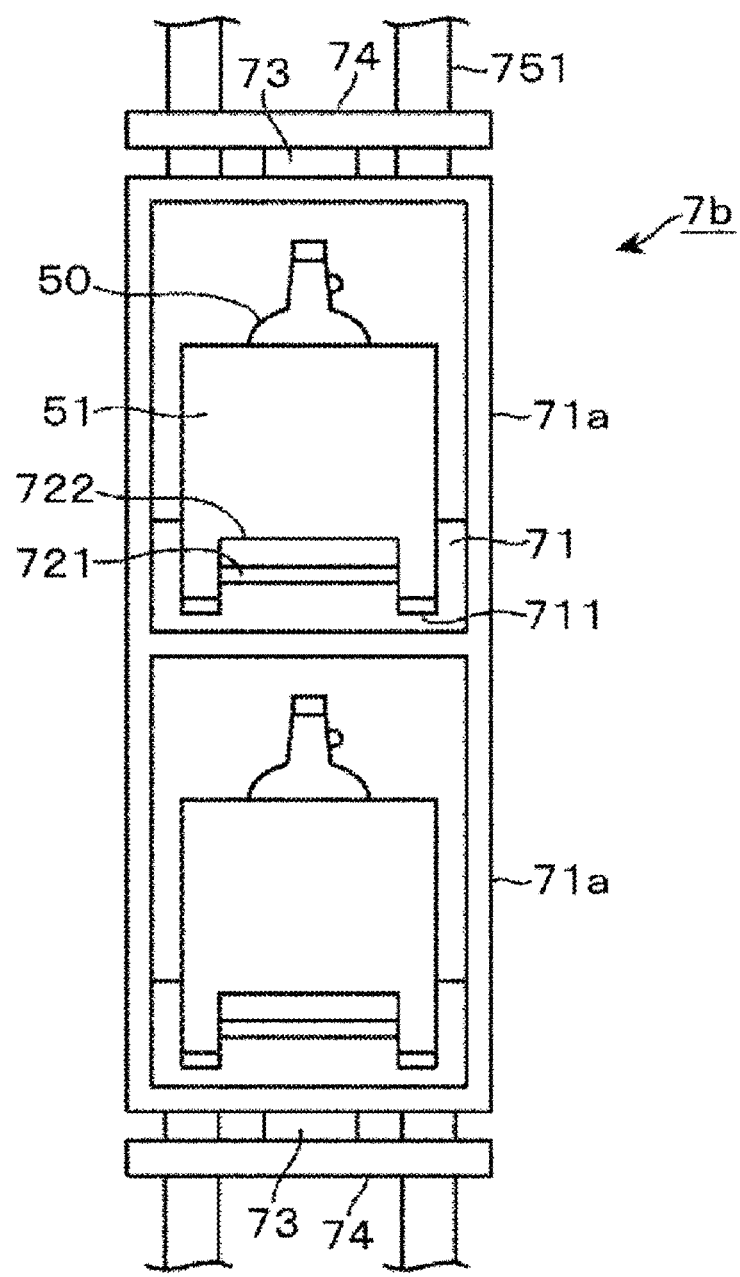
FIG. 12 is a front view illustrating still another example of the container transfer device.

The configuration of the container transfer device 7 configured to transfer the chemical liquid container 50 is not limited to the example illustrated in FIG. 2 and the like. By way of example, FIG. 11 and FIG. 12 illustrate other configuration examples. In these examples, components having the same functions as those of the above-described container transfer device 7 will be assigned the same reference numerals as assigned in the above-explained drawings (hereinafter, applied to the following coating and developing apparatuses 1a to 1d in the same manner).

In a container transfer device 7a depicted in FIG. 11, the main body 71 is configured to be horizontally moved along the extension direction of the moving rail 752, and the first and second arms 721 and 722 of each pair are configured to be extensible and contractible toward a direction intersecting with a movement direction of the main body 71, i.e., toward an arrangement direction of the container rack 60 (container mounting module 6) (see FIG. 2 and FIG. 3). Since the main body 71 is not rotated, a space required for moving the container transfer device 7a becomes small, so that an installation space for the chemical liquid block D2 can be small. In the case of using this container transfer device 7a, instead of providing the tray mounting table 69 at a side of the container loading/unloading opening 64a or under the container loading/unloading path 64b, the container transfer device 7a may be moved to the corresponding position, and the chemical liquid container 50 may be directly loaded and unloaded with respect to the container transfer device 7a.

Further, FIG. 12 illustrates a container transfer device 7b in which the chemical liquid containers 50 are vertically arranged in parallel to each other. In the present example, the first and second arms 721 and 722 are arranged in each of transfer racks 71a vertically stacked. Further, the transfer racks 71a are rotated as a whole around a rotation shaft 73 to face the tray mounting table 69 or the respective container mounting modules 6. Then, while the transfer racks 71a are moved up and down, the chemical liquid container 50 may be replaced. Even in this example, the rotation radius of the transfer racks 71a becomes small, so that an installation space for the chemical liquid block D2 can be small.

Figure 13:
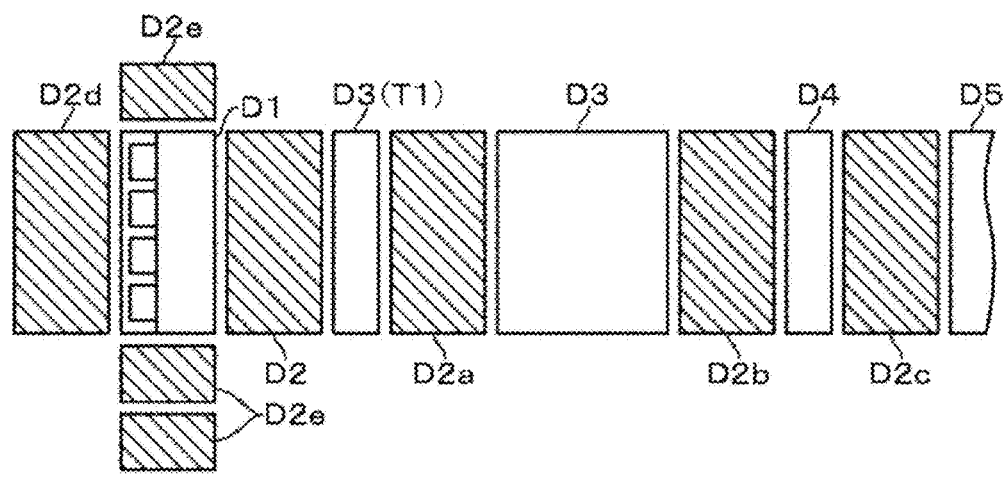
FIG. 13 is a schematic diagram illustrating a location where the chemical liquid block can be arranged in a coating and developing apparatus.

Hereinafter, a variation in an arrangement position of the chemical liquid block D2 will be explained. FIG. 13 illustrates arrangement positions of chemical liquid blocks D2, D2a to D2e indicated as hatched with diagonal lines.

Figure 14:
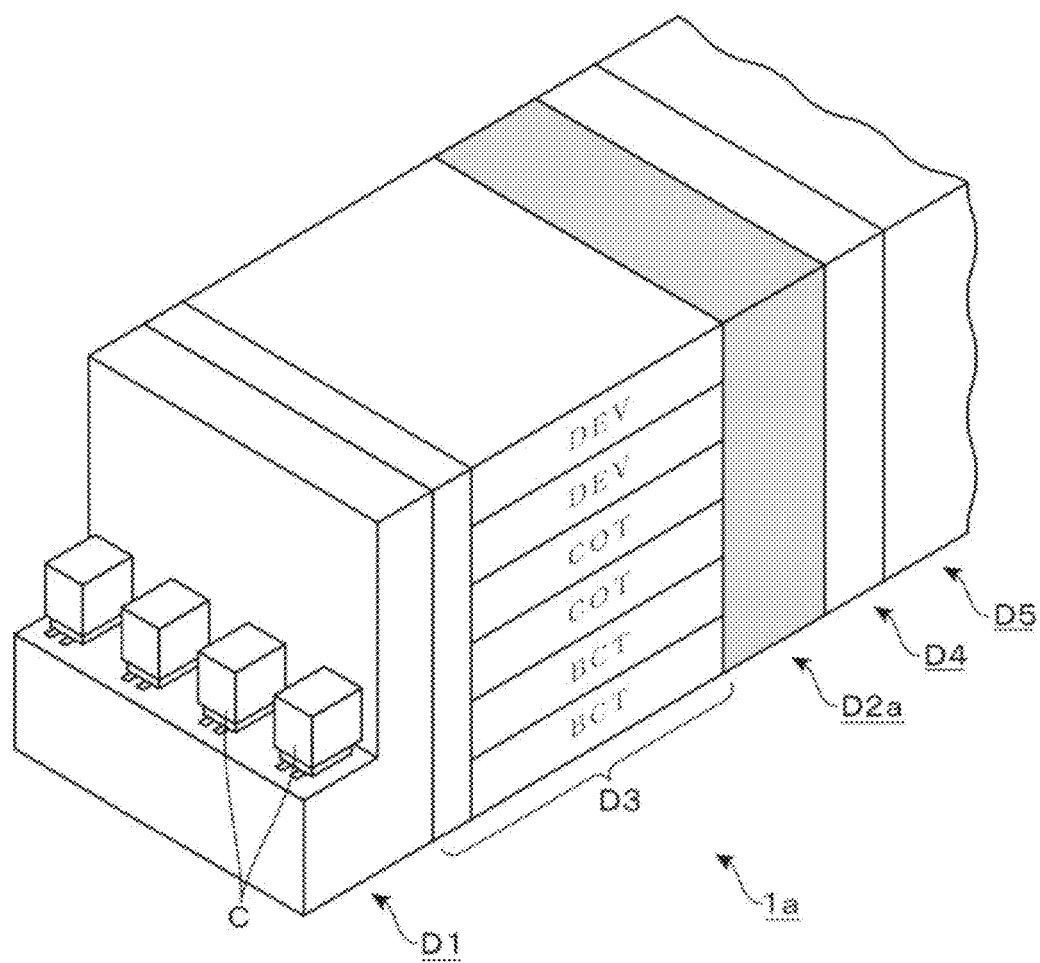
FIG. 14 is a perspective view of external appearance illustrating a second arrangement example of the chemical liquid block.

Since the wafer transfer path 65 is provided, if the wafer W is transferred through a space partitioned from the atmosphere within the chemical liquid block D2, the chemical liquid blocks D2a to D2c may be arranged between an arrangement region for the delivery arm 32 or the tower T1 in the processing block D3 and the region where the unit blocks B1 to B6 are stacked (chemical liquid block D2a in FIG. 13), between the processing block D3 and the interface block D4 (chemical liquid block D2b in FIG. 13), and between the interface block D4 and the exposure device D5 (chemical liquid block D2c in FIG. 13), in addition to the examples illustrated in FIG. 3 and FIG. 4. By way of example, FIG. 14 illustrates an example where the chemical liquid block D2a is arranged between the processing block D3 and the interface block D4. In this case, the wafer transfer path 65 and the shuttle arm 66 are provided such that the wafer W can be transferred at the delivery position between the delivery module TRS of the tower T2 provided in the interface block D4 and the unit blocks B1 to B6 of the processing block D3.

Figure 15:
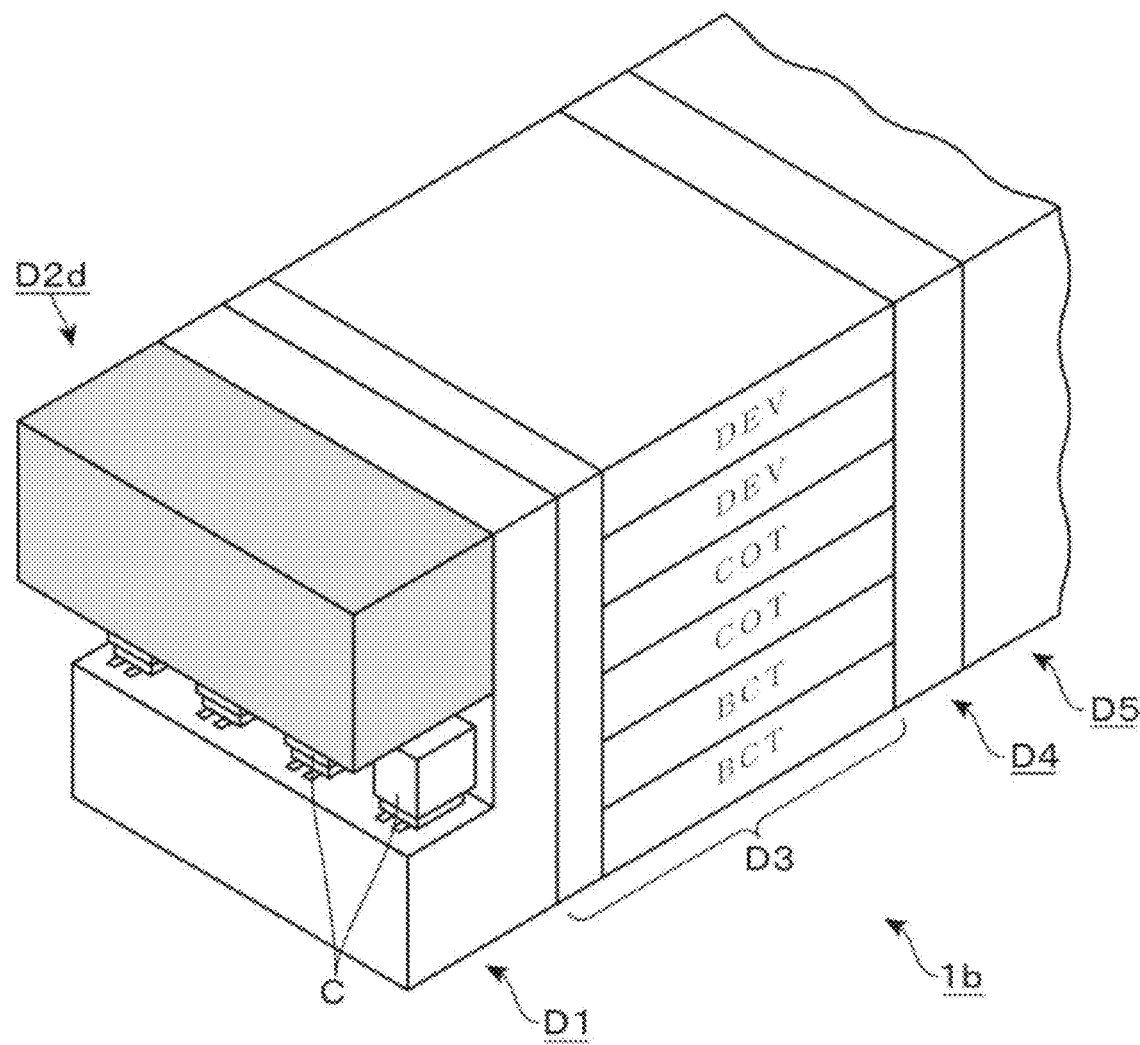
FIG. 15 is a perspective view of external appearance illustrating a third arrangement example of the chemical liquid block.
Figure 16:
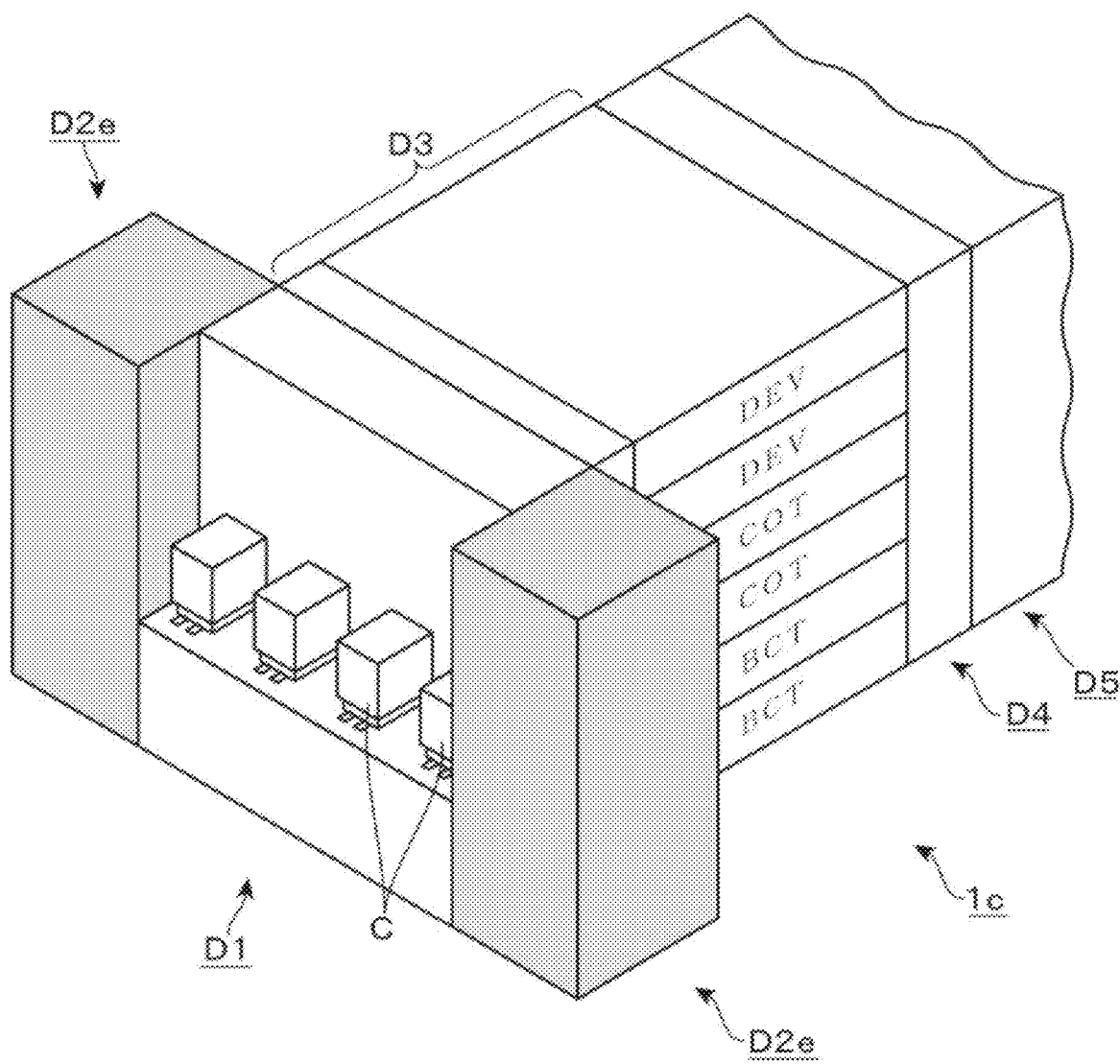
FIG. 16 is a perspective view of external appearance illustrating a fourth arrangement example of the chemical liquid block.

Further, as depicted in FIG. 15, in a coating and developing apparatus 1b, the chemical liquid block D2d may be provided above the mounting table 21 for the carriers C at the front side of the carrier block D1. Besides, as depicted in FIG. 16, the chemical liquid blocks D2e may be provided on the both sides of a main body (carrier block D1 in the example of FIG. 16) of a coating and developing apparatus 1c. Instead of providing the chemical liquid blocks D2e on the both sides of the main body of the coating and developing apparatus 1c as shown in the example of FIG. 16, the chemical liquid blocks D2e may be arranged on any one side thereof (see FIG. 13).

Hereinafter, a configuration of a coating and developing apparatus 1d in accordance with a second example embodiment will be explained with reference to FIG. 17 to FIG. 20. The coating and developing apparatus 1d in accordance with the second example embodiment is different from the coating and developing apparatus 1 of the first example embodiment, in which the container arrangement section is formed of the container rack 60 including the container mounting modules 6 vertically stacked, in that the container arrangement section is formed by horizontally arranging multiple container mounting modules 6 as arrangement regions where the chemical liquid containers 50 are arranged.

Figure 17:
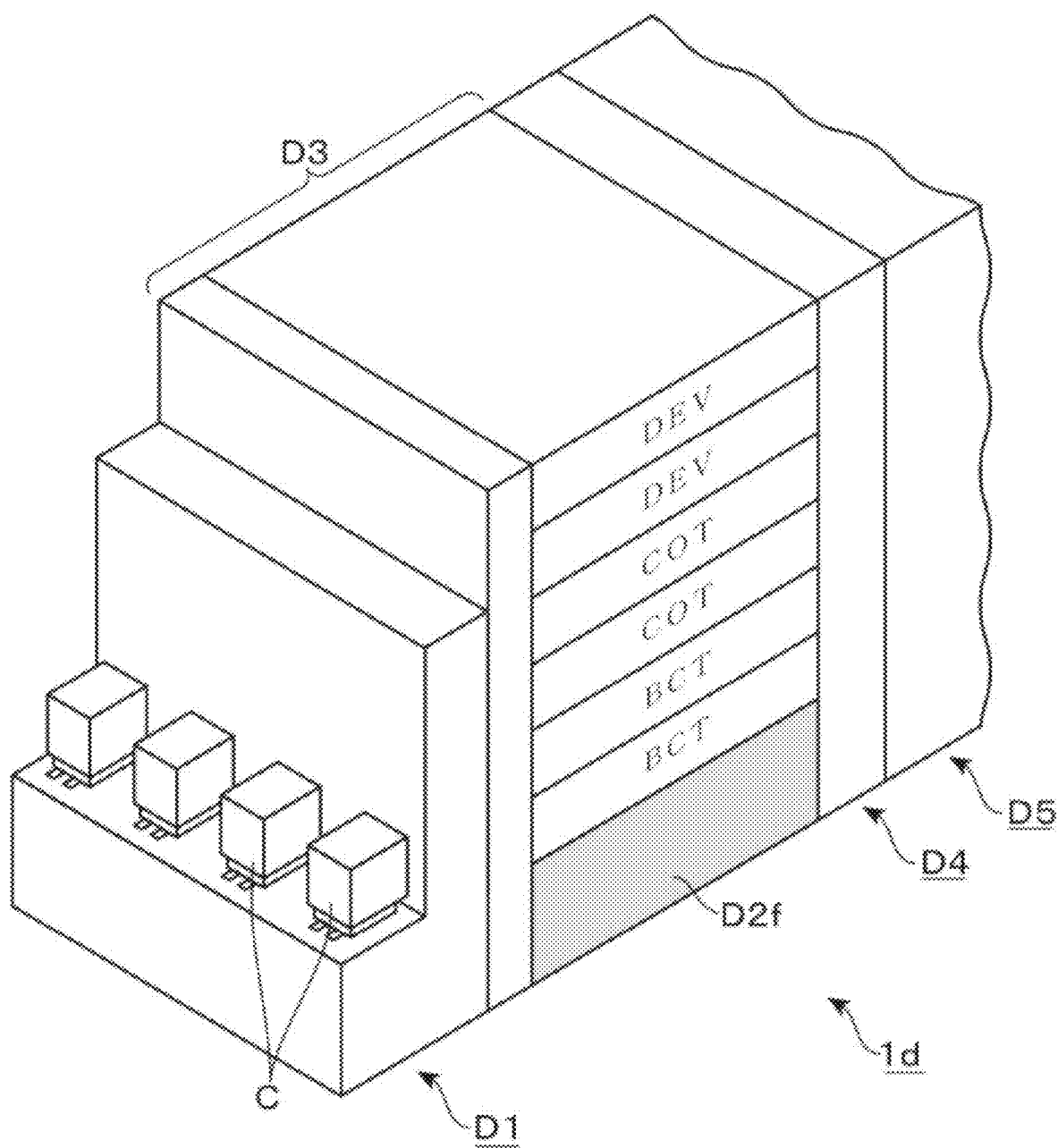
FIG. 17 is a perspective view of external appearance of a coating and developing apparatus in accordance with a second example embodiment.
Figure 19:
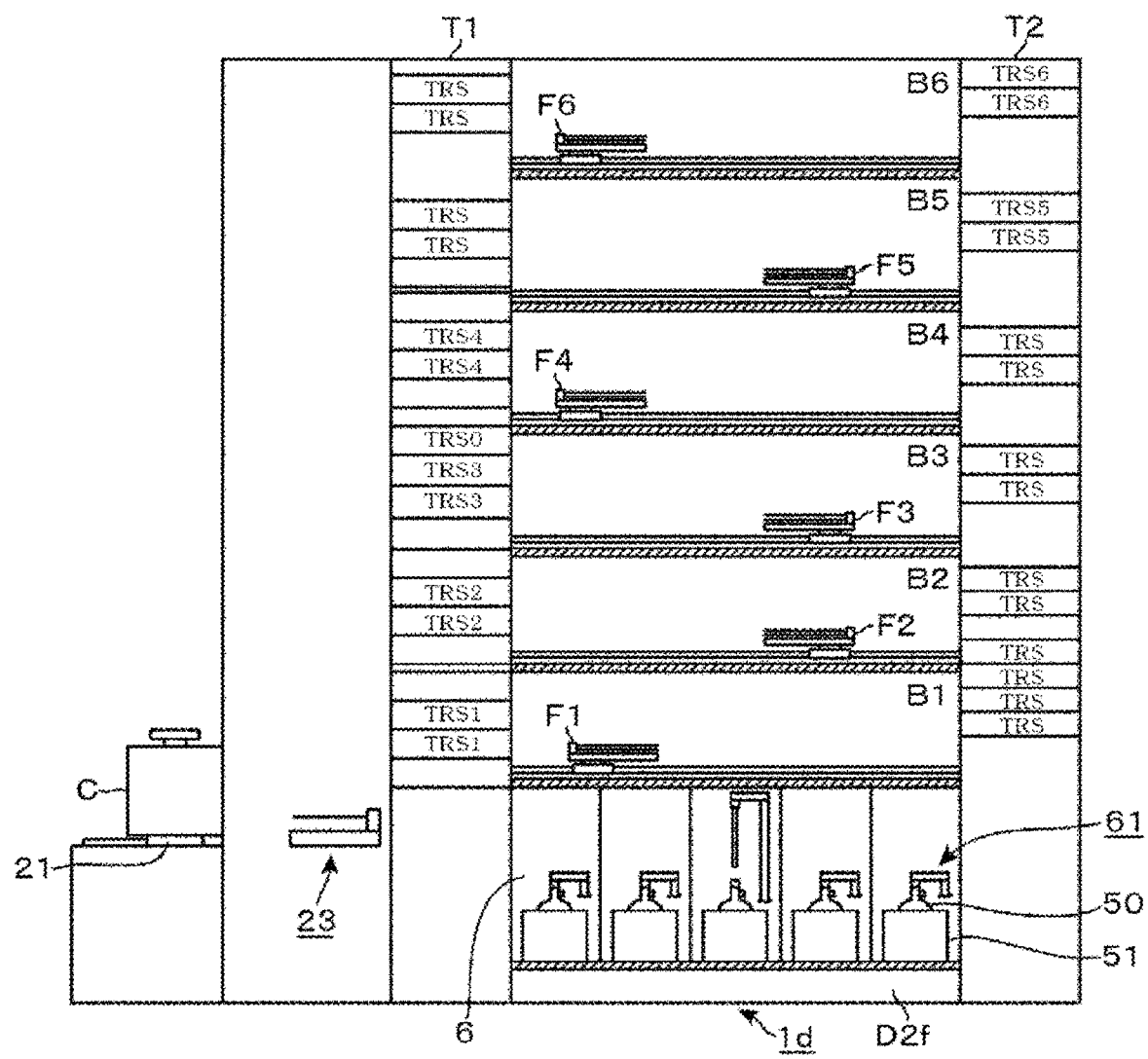
FIG. 19 is a longitudinal side view of the second coating and developing apparatus.

As depicted in FIG. 17 and FIG. 19, a chemical liquid block D2f of the second example embodiment is arranged under the region where the unit blocks B1 to B6 are stacked within the processing block D3, and is provided within a housing partitioned from the external atmosphere and the other blocks D1, D3, and D4. Each of the container mounting modules 6 has the same configuration as explained in the example with reference to FIG. 7 and FIG. 8, and, thus, redundant explanation thereof will be omitted.

Figure 18:
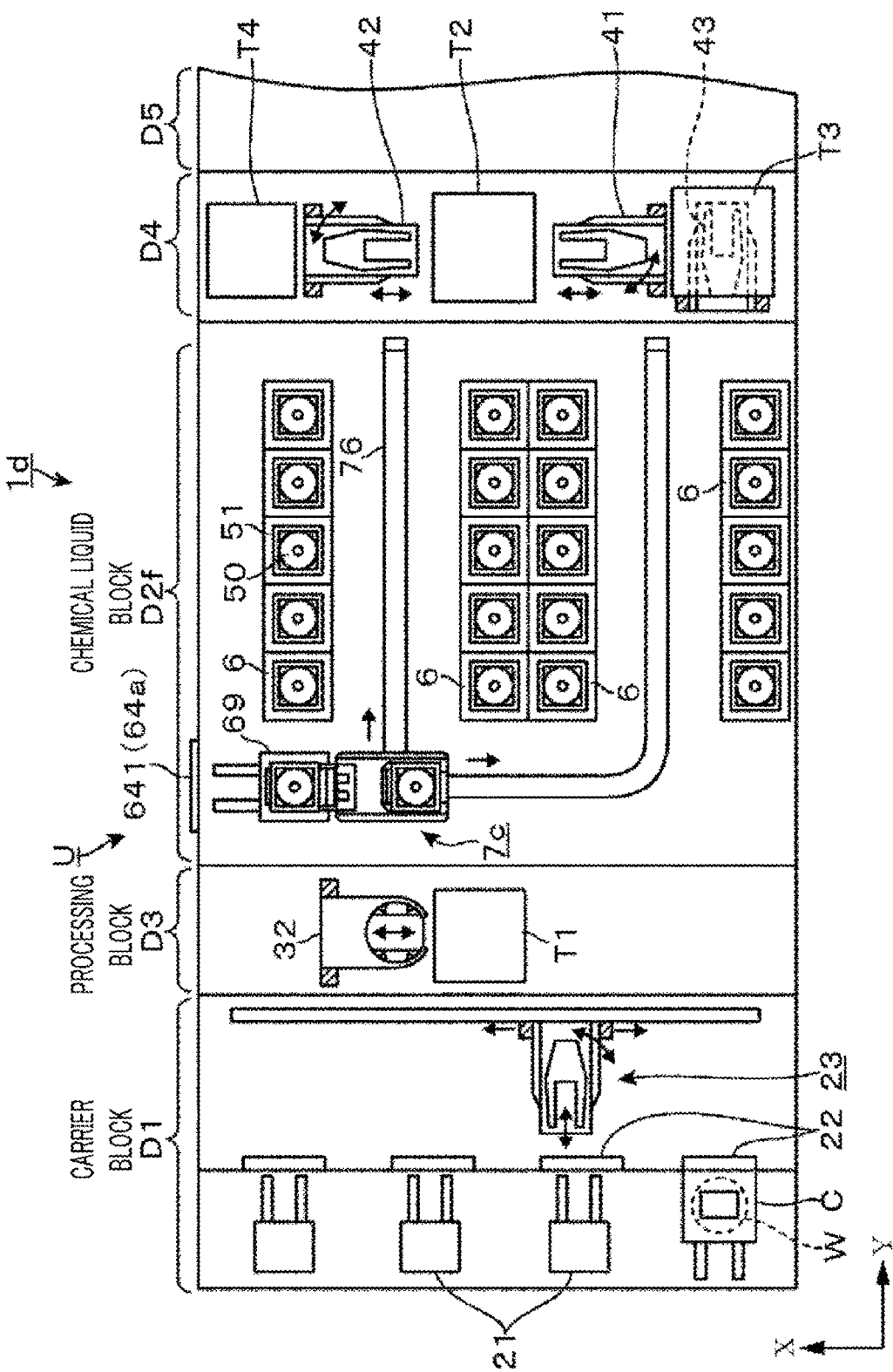
FIG. 18 is a plane view of the second coating and developing apparatus.

As depicted in FIG. 18 and FIG. 19, in the present example embodiment, five container mounting modules 6 (arrangement regions) are horizontally arranged in a row, and four rows are arranged as such. Thus, the container arrangement section is configured to accommodate a total of 20 chemical liquid containers 50. As depicted in FIG. 18, the rows of the container mounting modules 6 are arranged at intervals for moving the container transfer device 7c, and between these rows, a driving rail 76 forming a moving route of the container transfer device 7c is arranged in a U shape.

Figure 20:
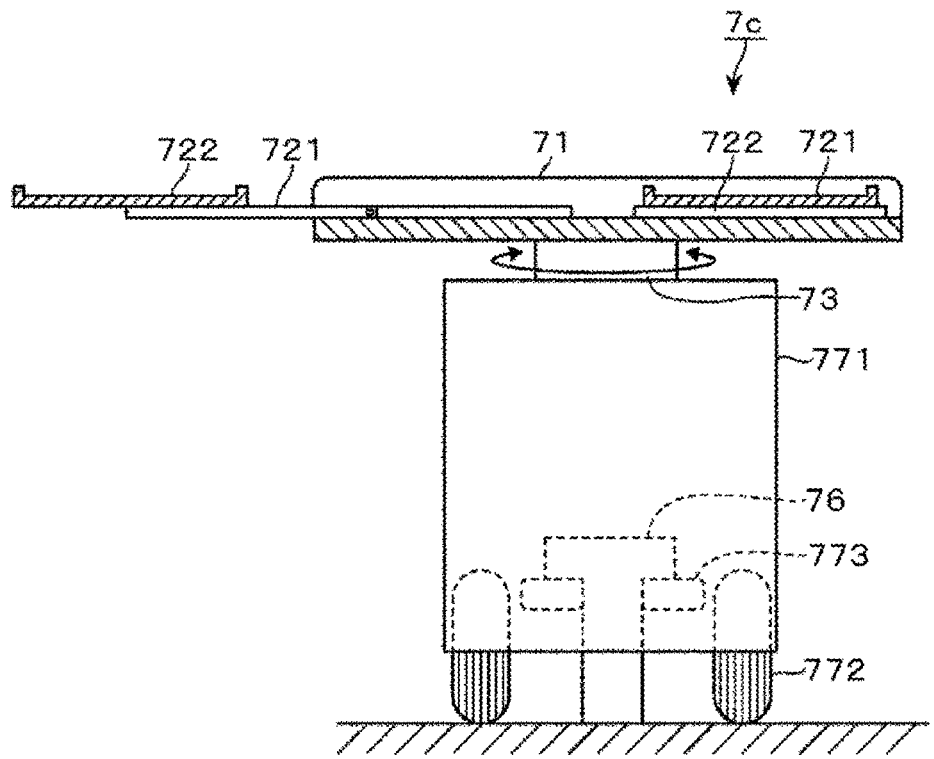
FIG. 20 is a side view illustrating a configuration example of a container transfer device provided in a chemical liquid block of the second coating and developing apparatus.

As depicted in FIG. 20, the container transfer device 7c has a configuration in which the above-described main body 71, the first and second arms 721 and 722, and the rotation shaft 73 are arranged on a frame body 771 including guide wheels 773 guided by the driving rail 76 like, for example, a straddle-type monorail. Further, container transfer device 7c is moved along a bottom surface of a chemical liquid block D2f through driving wheels 772. From a ceiling portion of the chemical liquid block D2f, for example, the clean air from the FFU 67 through a duct is supplied, so that a downward flow of the clean air is formed within a space of the chemical liquid block D2f.

In the coating and developing apparatus 1d of the present example embodiment, the operator may open the opening/closing device 641 depicted in FIG. 18 and mount the chemical liquid container 50 on the tray mounting table 69. Alternatively, the tray mounting table 69 may be moved to the outside of the coating and developing apparatus 1d through the container loading/unloading opening 64a with the opening/closing device 641 opened, and then, the chemical liquid container 50 may be mounted on the tray mounting table 69 from the OHT 101 and may be introduced into the chemical liquid block D2f.

Further, the chemical liquid block D2f may be provided on an upper end of the unit blocks B1 to B6 instead of providing the chemical liquid block D2f under the unit blocks B1 to B6 as depicted in FIG. 17 and FIG. 19. In this case, there is formed an opening which can be opened and closed by the opening/closing device 641 on the ceiling surface of the coating and developing apparatus 1d, and the chemical liquid container 50 may be loaded and unloaded through this opening by the OHT 101.

Even in the coating and developing apparatus 1d of the present example embodiment, it is possible to provide the container mounting module 6 within the chemical liquid block D2 partitioned from the external atmosphere and replace the chemical liquid container 50 without using the operator's hands. As a result, it is possible to replace the chemical liquid container 50 under the clean atmosphere and reduce contamination of the chemical liquid. Further, it is also possible to reduce deterioration of the chemical liquid by supplying the inert gas into the container mounting module 6.

Herein, a device of attaching and detaching the base end side of the chemical liquid supply path 338 with respect to the chemical liquid container 50 is not limited to the example of the nozzle attachment/detachment device 61 for the suction nozzle 611 as depicted in FIG. 7 and FIG. 8. By way of example, instead of the cover 501, a cover, which is formed of a rubber member and pushed into the opening of the chemical liquid container 50, may be connected to the base end side of the chemical liquid supply path 338. After the cover 501 is fitted into the chemical liquid container 50, the chemical liquid container 50 is reversed up and down. As a result, the chemical liquid can be supplied. In this case, the device of attaching and detaching the cover connected to the chemical liquid supply path 338 may serve as the above-described attachment/detachment device.

Further, instead of providing the cover opening/closing device 62 in each container mounting module 6, for example, a common cover opening/closing device 62 may be provided at a delivery position for the chemical liquid container 50 between the cover opening/closing device 62 and the container transfer device 7. After the cover 501 is opened here, the chemical liquid container 50 in an open state may be transferred to each container mounting module 6. The cover 501 separated from the chemical liquid container 50 may be collected into, for example, a common waste box and may be separately discarded. Furthermore, the completely used chemical liquid container 50 may be unloaded as being separated from the cover 501. In the present example embodiment, the chemical liquid container 50 is transferred as being separated from the cover 501, and, thus, the whole space within the chemical liquid block D2 may become under an inert gas atmosphere in order to suppress deterioration of the chemical liquid.

Herein, the ambient gas is introduced through the opening of the chemical liquid container 50 as described above. Therefore, the configuration in which the opening/closing door (shutter) is provided at the container mounting module 6 is not limited to the case where the inert gas is supplied into a region of the container mounting module 6. Even if the inert gas is not supplied, for example, the opening/closing door is usually closed and the opening/closing door is opened only when the chemical liquid container 50 is replaced. Therefore, it is possible to suppress introduction of particles from a space where the container transfer device 7 is moved. As a result, a chemical liquid can be supplied within a clean space.

Further, it is not required to necessarily provide the cover opening/closing device 62 in the container mounting module 6. By way of example, if a vial of which an opening is covered with a rubber sheet is used as the chemical liquid container 50, the suction nozzle 611 may be inserted into the chemical liquid container 50 by piercing the rubber sheet instead of separating the cover 501 with the cover opening/closing device 62.

Furthermore, if the container rack 60 is provided, in the container mounting section (row of the container mounting modules 6 in FIG. 18 or the container rack 60 in FIG. 4), it is not required to necessarily provide a partition configured to partition adjacent container mounting modules 6, and the chemical liquid container 50 may be arranged on a preset position (arrangement region) of a horizontally long common plate or table. In this case, the nozzle attachment/detachment device 61 or the cover opening/closing device 62 may be configured to be moved between multiple chemical liquid containers 50, so that the nozzle attachment/detachment device 61 or the cover opening/closing device 62 may be shared. Further, in this case, a mounting table, on which a base end of the chemical liquid supply path 338 or the cover 501 is mounted, may be provided near the arrangement region of each chemical liquid container 50.

Besides, a timing for providing the suction nozzle 611 or the chemical liquid supply path 338 to the chemical liquid container 50 is not limited to a timing after the chemical liquid container 50 is mounted on the container mounting module 6. After the chemical liquid container 50 is transferred into a region of the container mounting module 6, while the chemical liquid container 50 is held by the container transfer device 7, the cover 501 may be separated and the suction nozzle 611 and the like may be provided. Thereafter, the chemical liquid container 50 may be mounted on the container mounting module 6.

Figure 21:
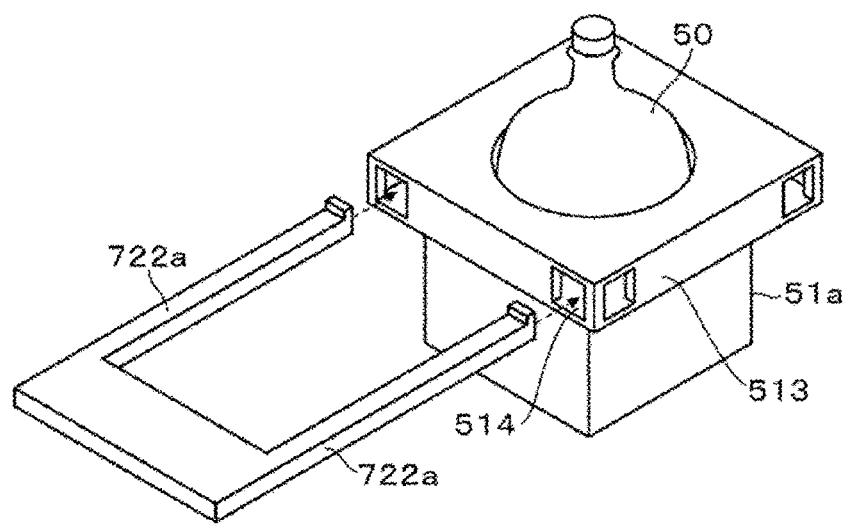
FIG. 21 is a perspective view illustrating another configuration example of an arm and a tray of a container transfer device.

FIG. 21 illustrates another configuration example of arms 722a and a tray 51a of the container transfer device 7 (7a to 7c). In the present example, on a top surface of the tray 51a, there is provided a flange 513 horizontally protruded in all directions and configured to be grasped by the grasping device 102 of the OHT 101. At each side of the flange 513, through holes 514 penetrating through the flange 513 are formed. Further, the two straight rod-shaped arms 722a provided at the container transfer device 7 (7a to 7c) and connected to each other at a base end side are inserted into these through holes 514 to raise the tray 51a. Thus, the chemical liquid container 50 accommodated within the tray 51a can be transferred.

Further, since a total of eight through holes 514 are formed at the sides of the flange 513, the arms 722a can be inserted into the tray 51a in any direction. As a result thereof, when the tray 51a is loaded into the chemical liquid block D2, even if a direction of the tray 51a is not matched with a preset direction, the tray 51a can be delivered to the container transfer device 7 (7a to 7c).

Figure 22:
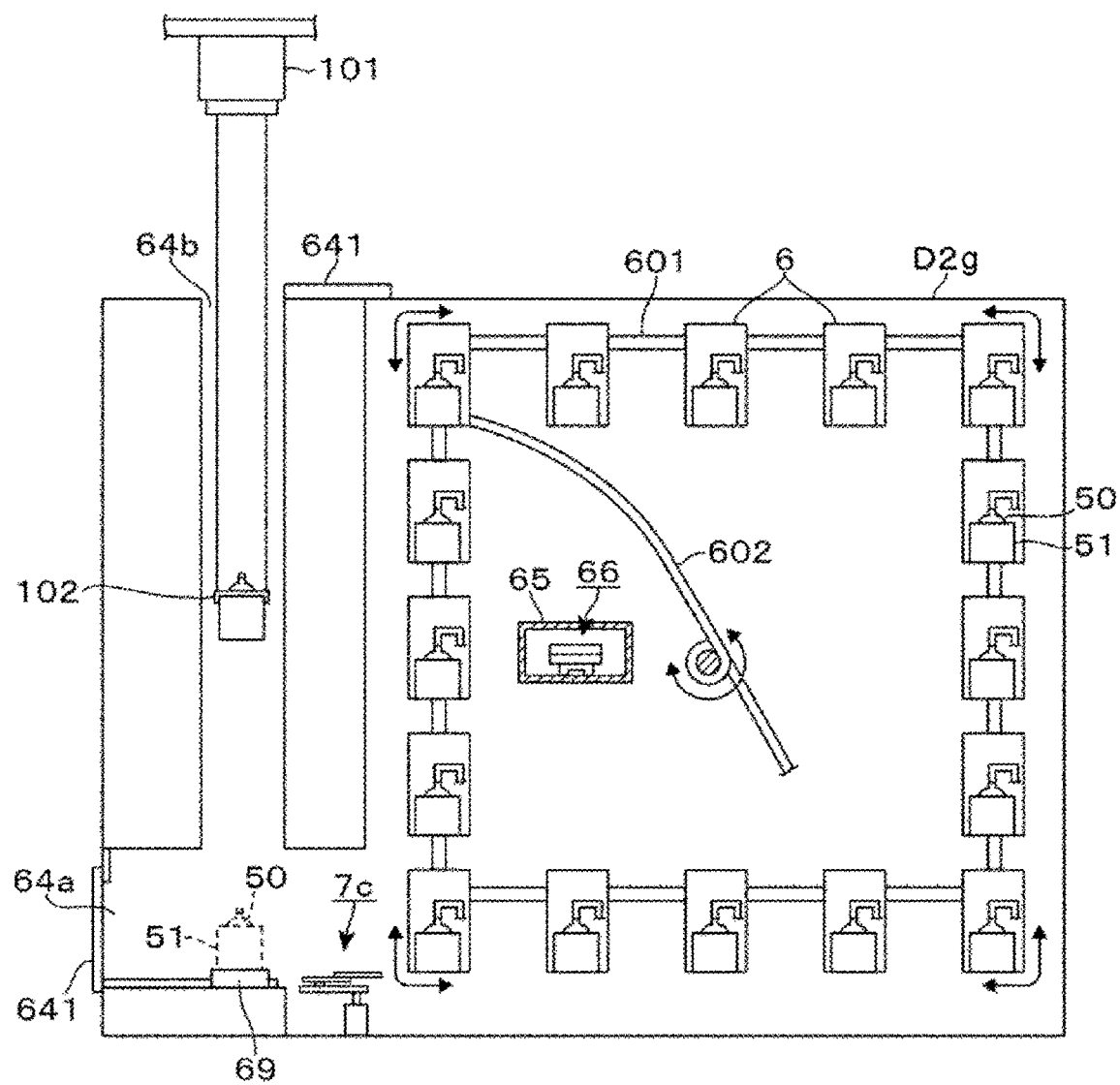
FIG. 22 is a longitudinal front view of a chemical liquid block in accordance with a third example embodiment.

FIG. 22 illustrates a longitudinal front view of a chemical liquid block in accordance with a third example embodiment. In a chemical liquid block D2g of the present example embodiment, the container arrangement section has a configuration in which a transfer belt 601 provided along the right and left inner wall surfaces, the ceiling surface, and the bottom surface thereof holds the container mounting module 6. Further, the transfer belt 601 is driven by a non-illustrated driving device and each container mounting module 6 is moved to the delivery position with respect to the tray mounting table 69. Then, the chemical liquid container 50 is replaced by a container transfer device 7c.

Each of the container mounting modules 6 is connected to the chemical liquid pump 681 via a collective line 602 collecting the chemical liquid supply paths 338 formed of flexible line members made of a resin. In the present example embodiment, a driving range where the collective line 602 can be moved without being interfered with the wafer transfer path 65 becomes the driving range of the transfer belt 601.

In the chemical liquid block D2g of the present example, it is not necessary to provide a space for moving the container transfer device 7c. Accordingly, it is possible to further reduce a width of the chemical liquid block D2g in the forward/backward direction.

Further, the wafer transfer path 65 provided in the chemical liquid block D2 (D2a to D2g) is not limited to be formed inside the cylindrical member. By way of example, plates serving as the ceiling surface and the bottom surface of the wafer transfer path 65 may be vertically arranged to face each other, and an air curtain may be formed at sides of the upper and lower plates opened toward a space within the chemical liquid block D2 such that the wafer transfer path 65 partitioned from the atmosphere of the chemical liquid block D2 can be formed.

Further, the container transfer device 7 or 7a to 7c does not need to transfer the chemical liquid container 50 as being accommodated in the tray 51 or 51a. A robot arm or the like may transfer the chemical liquid container 50 while directly holding a side surface or a bottom surface of the main body of the chemical liquid container 50.

Furthermore, the container transfer device 7 does not need to have a function of transferring multiple chemical liquid containers 50 at the same time. In this case, the completely used chemical liquid container 50 is unloaded from the container mounting module 6 where the chemical liquid container 50 is to be replaced to be transferred to the tray mounting table 69. After the completely used chemical liquid container 50 is unloaded, a new chemical liquid container 50 is received and transferred to the container mounting module 6 from which the completely used chemical liquid container 50 has been unloaded.

Moreover, a substrate processing apparatus to which the example embodiments can be applied is not limited to the coating and developing apparatus 1 that performs the resist coating and developing process on the wafer W. By way of example, the example embodiments can be applied to a cleaning apparatus in which multiple cleaning modules, each performing a cleaning process by supplying an alkaline or acid chemical liquid to a front surface or a rear surface of the wafer W, are provided within a processing block.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A substrate processing apparatus comprising:
a carrier block to which a carrier accommodating multiple substrates is loaded;
a processing block, horizontally arranged in parallel with the carrier block, including a liquid processing module configured to perform a liquid process on a substrate unloaded from the carrier within the carrier block by supplying a chemical liquid to the substrate; and
a chemical liquid block arranged in a row to be parallel with the carrier block and the processing block, provided between the carrier block and the processing block, and configured to accommodate multiple chemical liquid containers each storing the chemical liquid to be supplied to the liquid processing module,
wherein the chemical liquid block includes:
a container arrangement section provided with multiple arrangement positions in which the multiple chemical liquid containers are arranged in a direction orthogonal to an arrangement direction of the carrier block and the processing block;
a mounting table on which the chemical liquid container is placed, wherein the mounting table is configured to move the chemical liquid container; and
a transfer device commonly used for the multiple arrangement positions and configured to automatically replace a completely used chemical liquid container with a new chemical liquid container between the container arrangement section and the mounting table,
wherein the mounting table is moved between a position where the chemical liquid container is loaded/unloaded through a loading/unloading opening for the chemical liquid block and a position where the chemical liquid container is delivered to the transfer device,
a path for the substrate is extended along the arrangement direction of the carrier block and the processing block, and is formed through the chemical liquid block as a space surrounded by a cylindrical member, and the path for the substrate connects the carrier block to the processing block,
the transfer device comprises a main body supported by elevating rails,
the transfer device comprises a first arm and a second arm connected with each other, extended from the main body, and configured to be extensible and contractible between an extended position and a position where the chemical liquid container is on the main body, and
the path for the substrate is provided with a notch to allow the elevating rails to pass therethrough.

2. The substrate processing apparatus of claim 1,
wherein the liquid processing module includes a first liquid processing module configured to perform a liquid process on the substrate with a chemical liquid in order to form a coating film including a resist film on the substrate; and a second liquid processing module configured to perform a developing process on the substrate after being exposed with a developing liquid serving as the chemical liquid,
an interface block configured to transfer the substrate with respect to the processing block, and
the chemical liquid block is provided between the processing block and the interface block.

3. The substrate processing apparatus of claim 1,
wherein when an arrangement direction of the carrier block and the processing block is set to be a forward/backward direction, the loading/unloading opening for the chemical liquid container is formed at least one of left and right sides of the chemical liquid block while surrounding the chemical liquid block.

4. The substrate processing apparatus of claim 1,
wherein the loading/unloading opening for the chemical liquid container is formed on a ceiling portion surrounding the chemical liquid block.

* * * * *